(12) United States Patent
Shida

(10) Patent No.: US 11,102,436 B2
(45) Date of Patent: Aug. 24, 2021

(54) SOLID-STATE IMAGING DEVICE AND SIGNAL PROCESSING METHOD THEREOF, AND ELECTRONIC DEVICE

(71) Applicant: SONY SEMICONDUCTOR SOLUTIONS CORPORATION, Kanagawa (JP)

(72) Inventor: Sayaka Shida, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/329,388

(22) PCT Filed: Oct. 17, 2017

(86) PCT No.: PCT/JP2017/037476
§ 371 (c)(1),
(2) Date: Feb. 28, 2019

(87) PCT Pub. No.: WO2018/079331
PCT Pub. Date: May 3, 2018

(65) Prior Publication Data
US 2019/0253651 A1    Aug. 15, 2019

(30) Foreign Application Priority Data

Oct. 31, 2016 (JP) .............................. JP2016-213639

(51) Int. Cl.
*H04N 5/378* (2011.01)
*H01L 27/14* (2006.01)
(Continued)

(52) U.S. Cl.
CPC ............ *H04N 5/378* (2013.01); *G06F 15/80* (2013.01); *G06T 1/20* (2013.01); *H01L 27/14* (2013.01);
(Continued)

(58) Field of Classification Search
None
See application file for complete search history.

(56) References Cited

U.S. PATENT DOCUMENTS 5,293,481 A * 3/1994 Mita .......................... G06T 1/20
345/505
5,966,528 A * 10/1999 Wilkinson .......... G06F 9/30076
712/10
(Continued)

FOREIGN PATENT DOCUMENTS

CN          1993709 A      7/2007
CN        104429057 A      3/2015
(Continued)

OTHER PUBLICATIONS

International Search Report and Written Opinion of PCT Application No. PCT/JP2017/037476, dated Dec. 19, 2017, 09 pages of ISRWO.

*Primary Examiner* — Twyler L Haskins
*Assistant Examiner* — Wesley J Chiu
(74) *Attorney, Agent, or Firm* — Chip Law Group

(57) ABSTRACT

Provided is a solid-state imaging device that includes a pixel array portion in which a plurality of pixels are arranged in a two-dimensional array, an AD conversion unit configured to perform AD conversion with respect to a pixel signal output from the pixel of the pixel array portion, a memory configured to retain a digital pixel signal after the AD conversion, and an image signal processing circuit configured to perform predetermined signal processing with respect to the digital pixel signal. The image signal processing circuit includes two or more PUs including one or more PEs configured to execute predetermined arithmetic processing, and a CU configured to operate the PE in an SIMD
(Continued)

format, an IMEM configured to store one or more arithmetic processing instructions, and a CCU configured to control the PU.

8 Claims, 17 Drawing Sheets

(51) Int. Cl.
*H04N 5/369* (2011.01)
*H01L 27/146* (2006.01)
*G06T 1/20* (2006.01)
*G06F 15/80* (2006.01)

(52) U.S. Cl.
CPC ........... *H01L 27/146* (2013.01); *H04N 5/379* (2018.08); *G06T 2210/52* (2013.01)

(56) References Cited

U.S. PATENT DOCUMENTS

| | | | | |
|---|---|---|---|---|
| 7,511,738 B1* | 3/2009 | Kancler | ................... | G06T 3/608 348/208.99 |
| 8,464,025 B2* | 6/2013 | Yamaguchi | ............... | G06T 1/20 712/22 |
| 9,456,195 B1* | 9/2016 | Wajs | ................... | H04N 5/23229 |
| 2002/0195544 A1* | 12/2002 | Yamashita | ............. | H04N 5/335 250/208.1 |
| 2005/0238102 A1* | 10/2005 | Lee | ........................ | H04N 19/53 375/240.16 |
| 2009/0006773 A1* | 1/2009 | Yamaguchi | ............. | G06F 15/80 711/154 |
| 2013/0258151 A1* | 10/2013 | Ayers | ................... | H04N 5/3575 348/302 |
| 2014/0078367 A1* | 3/2014 | Sonoda | ................ | H04N 5/3745 348/303 |
| 2015/0163403 A1* | 6/2015 | Wakabayashi | ....... | H04N 5/3745 348/308 |
| 2017/0142387 A1* | 5/2017 | Saito | .................. | H04N 5/23229 |
| 2017/0150094 A1* | 5/2017 | Miyamoto | ............. | H04N 5/335 |

FOREIGN PATENT DOCUMENTS

| | | |
|---|---|---|
| EP | 1883045 A1 | 1/2008 |
| EP | 2871835 A1 | 5/2015 |
| JP | 2001-250113 A | 9/2001 |
| JP | 2002-094886 A | 3/2002 |
| KR | 10-2008-0010377 A | 1/2008 |
| KR | 10-2015-0035722 A | 4/2015 |
| WO | 2006/123822 A1 | 11/2006 |
| WO | 2014/007004 A1 | 1/2014 |

* cited by examiner

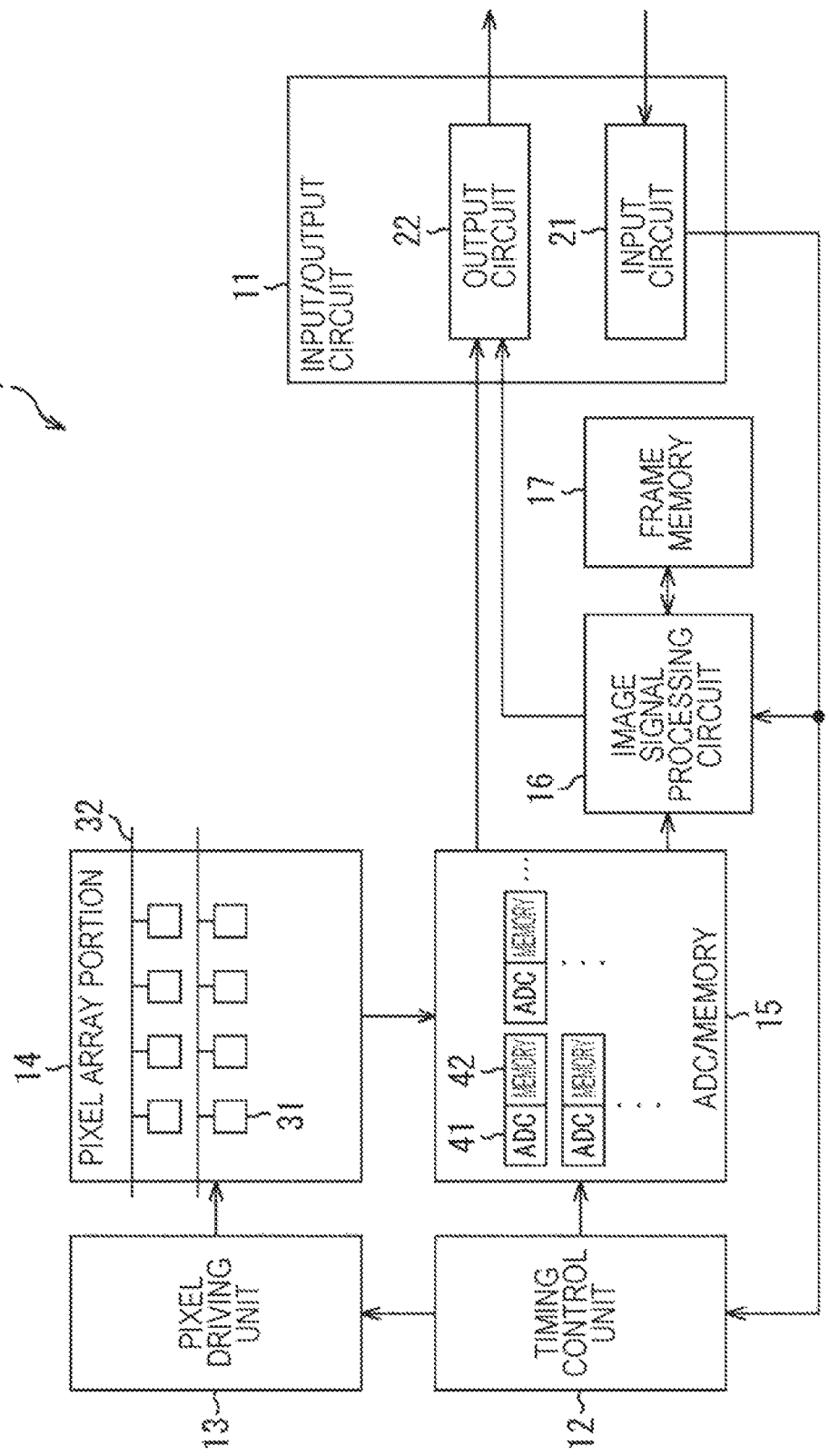

FIG. 2A
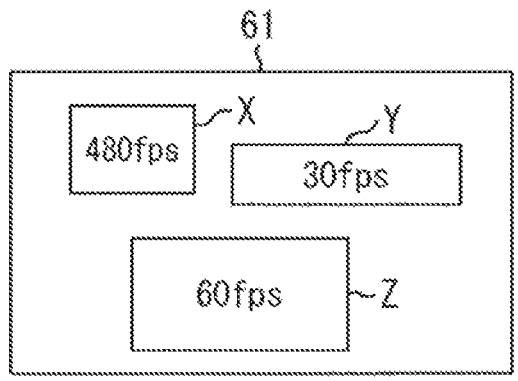
FIG. 2B
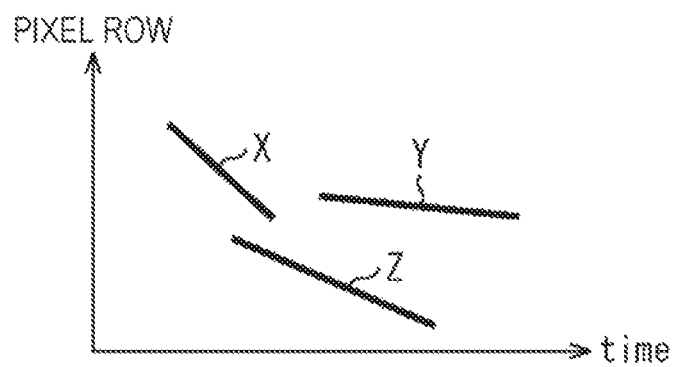
FIG. 2C
| REGION X | Process M1 | Process M2 |
| REGION Y | Process N | |
| REGION Z | Process L | Process N |

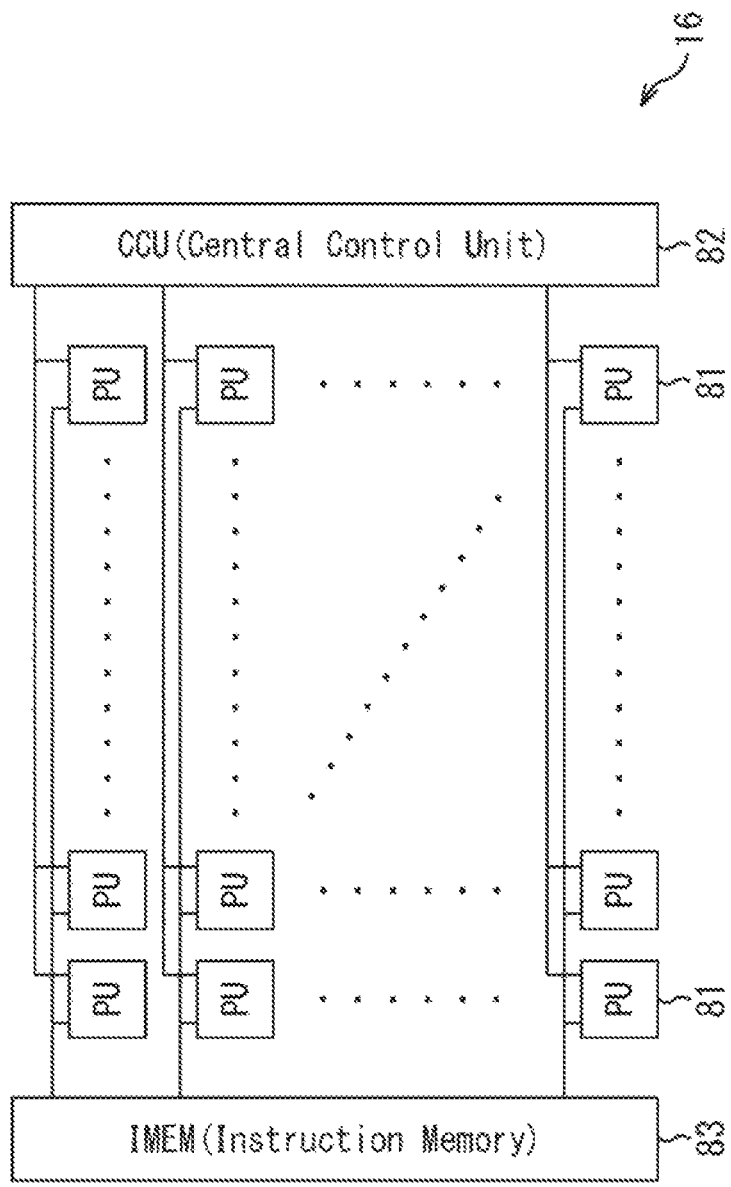

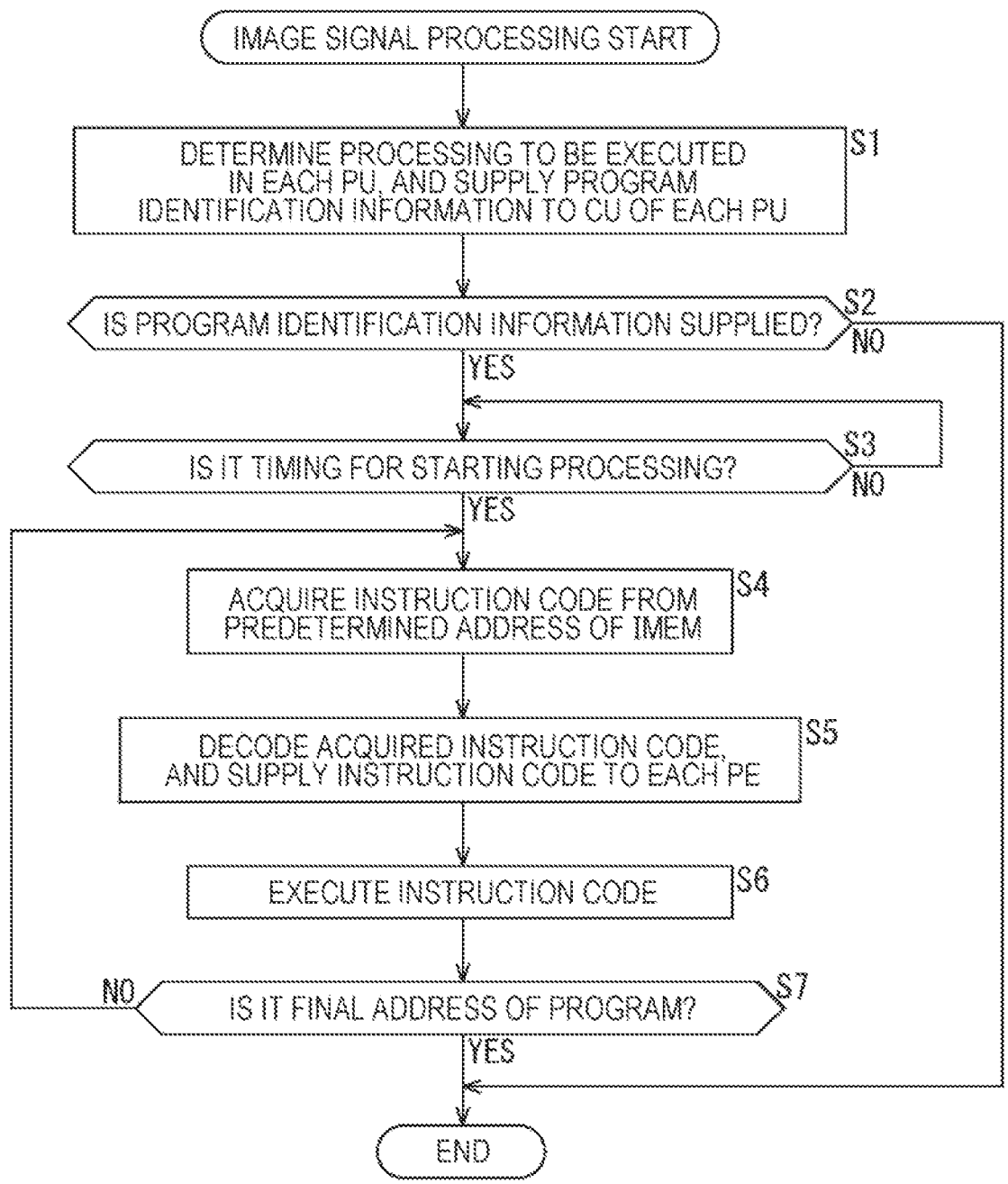

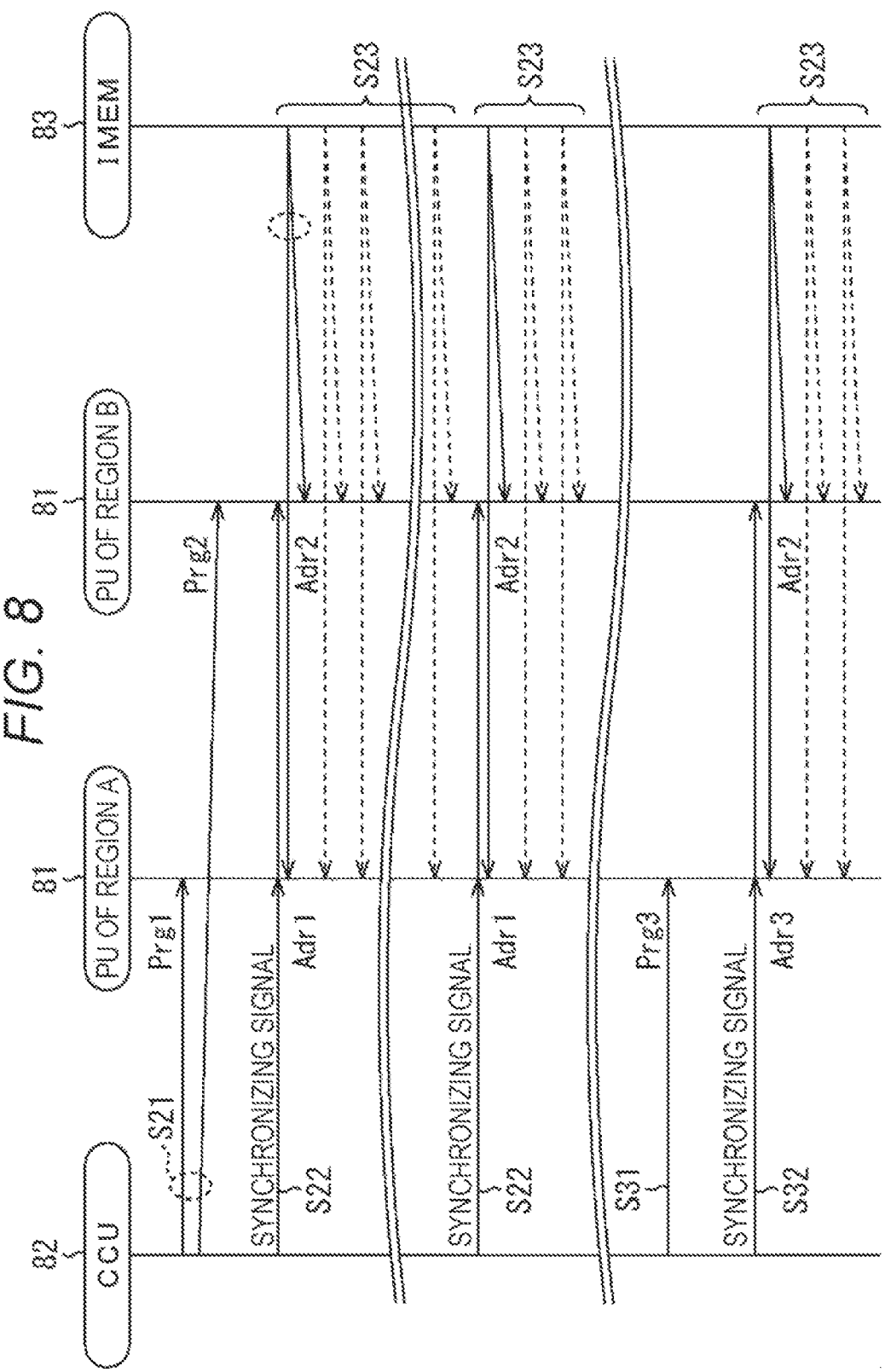

SOLID-STATE IMAGING DEVICE AND SIGNAL PROCESSING METHOD THEREOF, AND ELECTRONIC DEVICE

CROSS REFERENCE TO RELATED APPLICATIONS

This application is a U.S. National Phase of International Patent Application No. PCT/JP2017/037476 filed on Oct. 17, 2017, which claims priority benefit of Japanese Patent Application No. JP 2016-213639 filed in the Japan Patent Office on Oct. 31, 2016. Each of the above-referenced applications is hereby incorporated herein by reference in its entirety.

TECHNICAL FIELD

The present technology relates to a solid-state imaging device and a signal processing method thereof, and an electronic device, and in particular, relates to a solid-state imaging device and a signal processing method thereof, in which it is possible to correspond to an arbitrary change in imaging processing of a pixel array portion, and an electronic device.

BACKGROUND ART

In a MOS type image sensor, it is possible to integrate not only an imaging element, but also other integrated circuit elements, in particular, a digital signal processing circuit or a memory element, into the same shape of a chip, and for example, an MOS type solid-state imaging device in which a plurality of processor elements (PE) are formed in one chip, has been proposed (for example, refer to Patent Document 1).

CITATION LIST

Patent Document

Patent Document 1: Japanese Patent Application Laid-Open No. 2001-250113

SUMMARY OF THE INVENTION

Problems to be Solved by the Invention

However, for example, in the future, in a case of corresponding to an ultrahigh frame rate of 1000 frames per second (fps) or the like, or in a case of performing different processings in a plurality of regions of a pixel array portion, there is a limit on the control of a plurality of PEs by using firmware.

The present technology has been made in consideration of such circumstances described above, and is capable of corresponding to an arbitrary change in imaging processing of a pixel array portion.

Solutions to Problems

A solid-state imaging device of a first aspect of the present technology, including: a pixel array portion in which a plurality of pixels are arranged in a two-dimensional array; an AD conversion unit configured to perform AD conversion with respect to a pixel signal output from the pixel of the pixel array portion; a memory configured to retain a digital pixel signal after the AD conversion; and an image signal processing circuit configured to perform predetermined signal processing with respect to the digital pixel signal, in which the image signal processing circuit includes: two or more process units including one or more processor elements configured to execute predetermined arithmetic processing, and a control unit configured to operate the processor element in an SIMD format; an instruction memory configured to store one or more arithmetic processing instructions; and a central control unit configured to control the process unit.

A signal processing method of a solid-state imaging device of a second aspect of the present technology, the solid-state imaging device including a pixel array portion in which a plurality of pixels are arranged in a two-dimensional array, an AD conversion unit configured to perform AD conversion with respect to a pixel signal output from the pixel of the pixel array portion, a memory configured to retain a digital pixel signal after the AD conversion, and an image signal processing circuit configured to perform predetermined signal processing with respect to the digital pixel signal, the image signal processing circuit including two or more process units including one or more processor elements configured to execute predetermined arithmetic processing, and a control unit configured to operate the processor element in an SIMD format, an instruction memory configured to store one or more arithmetic processing instructions, and a central control unit configured to control the process unit, the method including: allowing the central control unit to determine processing to be performed by the process unit; and allowing the control unit to acquire the arithmetic processing instruction from the instruction memory, according to control of the central control unit, and to execute the arithmetic processing in the SIMD format by the processor element.

An electronic device of a third aspect of the present technology, including: a solid-state imaging device including: a pixel array portion in which a plurality of pixels are arranged in a two-dimensional array; an AD conversion unit configured to perform AD conversion with respect to a pixel signal output from the pixel of the pixel array portion; a memory configured to retain a digital pixel signal after the AD conversion; and an image signal processing circuit configured to perform predetermined signal processing with respect to the digital pixel signal, in which the image signal processing circuit includes: two or more process units including one or more processor elements configured to execute predetermined arithmetic processing, and a control unit configured to operate the processor element in an SIMD format; an instruction memory configured to store one or more arithmetic processing instructions; and a central control unit configured to control the process unit.

In the first aspect to the third aspect of the present technology, in one or more processor elements of the image signal processing circuit of the solid-state imaging device, the predetermined arithmetic processing is executed in the SIMD format.

The solid-state imaging device and the electronic device may be an independent device, or may be a module to be built in other devices.

Effects of the Invention

According to the first aspect to the third aspect of the present technology, it is possible to correspond to an arbitrary change in imaging processing of a pixel array portion.

In addition, the effects described therein are not necessarily limited and may be any of the effects described in the present disclosure.

BRIEF DESCRIPTION OF DRAWINGS

FIG. 1 is a block diagram illustrating a schematic configuration of a solid-state imaging device to which the present technology is applied.

FIGS. 2A, 2B, and 2C are diagrams illustrating an imaging processing example of a pixel array portion.

FIG. 3 is a diagram illustrating configuration example of an image signal processing circuit.

FIG. 7 is a flowchart illustrating image signal processing.

FIG. 8 is a flowchart illustrating each processing in parallel.

MODE FOR CARRYING OUT THE INVENTION

Figure 4:
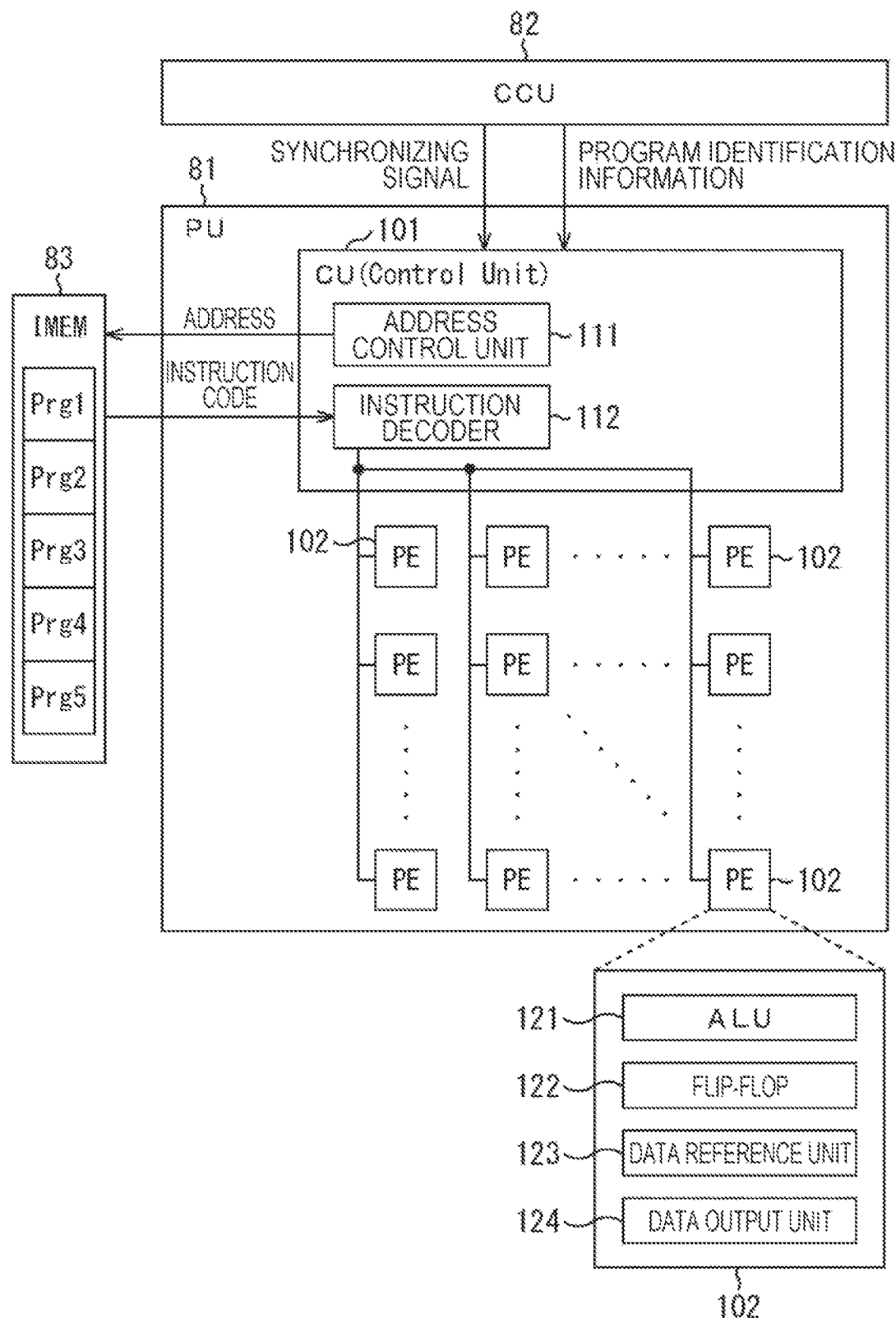
FIG. 4 is a diagram illustrating the detailed configuration of a PU.

Hereinafter, a mode for carrying out the present technology (hereinafter, referred to as an embodiment) will be described. Furthermore, the description will be given in the following order.

1. Schematic Configuration Example of Solid-State Imaging Device
2. Imaging Processing Example of Pixel Array Portion
3. Configuration Example of Image Signal Processing Circuit
4. Image Signal Processing Execution Example
5. Laminated Structure Example of Solid-State Imaging Device
6. Numbers of PUs and PEs
7. Application Example with respect to Electronic Device
<1. Schematic Configuration Example of Solid-State Imaging Device>

FIG. 1 is a block diagram illustrating a schematic configuration of a solid-state imaging device to which the present technology is applied.

A solid-state imaging device 1 of FIG. 1 includes an input/output circuit 11, a timing control unit 12, a pixel driving unit 13, a pixel array portion 14, an ADC/memory 15, an image signal processing circuit 16, and a frame memory 17.

The input/output circuit 11 includes an input circuit 21 and an output circuit 22.

A control signal of designating an imaging operation of the solid-state imaging device 1, for example, an imaging region in the pixel array portion 14 or an imaging timing, processing contents of post-processing of an image signal, and the like, is input into the input circuit 21 from the external circuit (not illustrated). The input circuit 21 supplies various input control signals to the timing control unit 12, the image signal processing circuit 16, or the like.

The output circuit 22 acquires the image signal supplied from the ADC/memory 15 or the image signal processing circuit 16, and outputs the image signal to the outside.

The timing control unit 12 includes a timing generator generating various timing signals such as a vertical synchronizing signal, a horizontal synchronizing signal, and the like. The timing control unit 12 supplies various timing signals generated by the timing generator, to the pixel driving unit 13, the ADC/memory 15, and the image signal processing circuit 16, and controls an operation timing of each of the units.

The pixel driving unit 13, for example, includes a shift register, sequentially performs selective scanning with respect to each pixel of the pixel array portion 14 in a vertical direction, in row unit, and outputs a pixel signal based on a signal charge generated according to the received light amount in a photoelectric conversion unit of each of the pixels 31, to the ADC/memory 15.

The pixel array portion 14 is configured by arranging a plurality of pixels 31 including a photodiode that is the photoelectric conversion unit, and a plurality of pixel transistors (so-called MOS transistors), in a two-dimensional array (in a row direction and a column direction). The plurality of pixel transistors, for example, are capable of including three transistors of a transfer transistor, a reset transistor, and an amplification transistor. The pixel is capable of including four transistors in which a selection transistor is added to the transistors described above.

Each of the pixels 31 of the pixel array portion 14 performs exposure (light reception) and the output of the pixel signal, on the basis of a driving signal supplied from the pixel driving unit 13 through a row driving signal line 32. The pixel signal generated in each of the pixels 31, is output to the ADC/memory 15.

The ADC/memory 15 includes a plurality of AD conversion (ADC) units 41 arranged such that one ADC 41 corresponds to one or more pixels 31, and a plurality of memories 42 arranged such that one memory 42 corresponds to one or more pixels 31.

As described later with reference to FIGS. 9A, 9B, 9C, 10A, 10B, 10C, 11A, 11B, 11C, 12A, 12B, 12C, 13A, 13B, 14A, and 14B, and the like, the pixel array portion 14 and the ADC/memory 15 are arranged by being laminated up and down, and the ADC 41 and the memory 42 are arranged in a two-dimensional array to correspond to one or more pixels 31.

The ADC 41 performs correlated double sampling (CDS) processing with respect to the pixel signal output from each of the pixels 31, and thus, performs the AD conversion with respect to the pixel signal, and eliminates a reset noise. For example, the ADC 41 includes a comparator unit for comparing an analog signal that is a conversion target, with a reference sweep signal that is a comparison target, and a counter unit measuring a time until a comparison result of the comparator unit is inverted. The ADC 41 stores a digital pixel signal after the AD conversion, in the memory 42.

The memory 42 retains the digital pixel signal output from the ADC 41, for a predetermined period, and outputs the digital pixel signal to the image signal processing circuit 16 or the output circuit 22.

The image signal processing circuit 16 is a circuit performing various signal processings with respect to the digital pixel signal supplied from the ADC/memory 15. For example, the image signal processing circuit 16 is capable of performing gradation conversion processing of converting a gradation of each pixel signal in the entire imaging region of the pixel array portion 14, filter processing with respect to a part of the imaging region, and the like.

The image signal processing circuit 16 is capable of receiving a processing control signal indicating which signal processing is performed with respect to the pixel signal, from the external circuit through the input circuit 21.

The frame memory 17 retains imaging data (the pixel signal) for one frame, supplied from the ADC/memory 15, and as necessary, supplies the imaging data to the image signal processing circuit 16. Furthermore, there is also a case where the frame memory 17 is omitted.

The solid-state imaging device 1 configured as described above, for example, is a CMOS image sensor in which the ADC 41 and the memory 42 are provided in unit of one or more pixels of the pixel array portion 14.

<2. Imaging Processing Example of Pixel Array Portion>

FIGS. 2A, 2B, and 2C illustrate an imaging processing example of the pixel array portion 14.

As illustrated in FIG. 2A, the solid-state imaging device 1 divides an effective pixel region 61 of the pixel array portion 14 into a plurality of processing regions, and thus, is capable of driving each of the processing regions at different frame rates, or of performing different processings in each of the processing regions.

For example, as illustrated in FIG. 2A, a processing region X of a part of the effective pixel region 61, can be driven at a frame rate of 480 fps, a processing region Y of a part of the effective pixel region 61, can be driven at a frame rate of 30 fps, and a processing region Z of a part of the effective pixel region 61, can be driven at a frame rate of 60 fps.

As illustrated in FIG. 2B, timings when pixel signals of each of the processing regions X, Y, and Z are read out (output) to the ADC/memory 15, are also different from each other.

As illustrated in FIG. 2C, the image signal processing circuit 16 performs different arithmetic processings with respect to the pixel signals of each of the processing regions X, Y, and Z. The image signal processing circuit 16 executes processing M (Process M1 and Process M2) with respect to the pixel signal obtained in the processing region X. In addition, the image signal processing circuit 16 executes processing N (Process N) with respect to the pixel signal obtained in the processing region Y, and sequentially executes two processings of processing L (Process L) and processing N (Process N) with respect to the pixel signal obtained in the processing region Z.

In the example of FIGS. 2A, 2B, and 2C, there are a plurality of processing regions in which predetermined processing is performed with respect to the effective pixel region 61 of the pixel array portion 14, and the processings to be executed in each of the plurality of processing regions (the processings M, L, N, and the like) or the frame rates are different from each other.

However, control of setting the processing region in which the processing is performed with respect to the effective pixel region 61 of the pixel array portion 14, to one partial region, or control of executing the same processing with respect to two processing regions in three or more processing regions, or of executing the processing at the same frame rate, can also be performed.

<3. Configuration Example of Image Signal Processing Circuit>

FIG. 3 illustrates a configuration example of the image signal processing circuit 16 for executing different processings in the plurality of processing regions of the pixel array portion 14 as illustrated in FIGS. 2A, 2B, and 2C.

The image signal processing circuit 16 includes a plurality of process units (PU) 81, a central control unit (CCU) 82 controlling each of the PUs 81, and an instruction memory (IMEM) 83 in which a plurality of arithmetic processing instructions to be used in each of the PUs 81 (hereinafter, simply referred to as an instruction) are stored.

The details of the PU 81, the CCU 82, and the IMEM 83 will be described with reference to FIG. 4.

FIG. 4 is a diagram illustrating the detailed configuration of one PU 81, along with the CCU 82 and the IMEM 83. Each of the plurality of PUs 81 in the image signal processing circuit 16, has the same configuration as that of the PU 81 in FIG. 4.

The PU 81 includes a control unit (CU) 101, and a plurality of processor elements (PEs) 102 connected in plane parallel. Here, the PUs 81, for example, are arranged at a proportion of one to the plurality of pixels, and the PEs 102, for example, are arranged at a proportion of one to one pixel. In this case, in a case where a total of 25 PEs 102 of 5×5 are provided in one PU 81, the PUs 81 are arranged at a proportion of one to 25 pixels. The fact that the plurality of PEs 102 are connected in plane parallel, indicates that the plurality of PEs 102 are connected to the CU 101 in parallel, and the pixel signals of the plurality of pixels in a plane region of the pixel array portion 14 (N×M of N in the row direction and M in the column direction) are subjected to parallel processing.

The CCU 82 determines which processing is executed with respect to each of the plurality of PUs 81, on the basis of the processing control signal supplied from the outside through the input circuit 21. Furthermore, in a case where there are a plurality of processings as the processing to be performed in the PU 81, the CCU 82 also determines in which order, the plurality of processings are executed, which processing is preferentially executed (one processing is executed, and the other processing is not executed), or the like.

Then, the CCU 82 supplies a program identification information of identifying a program corresponding to the determined processing, to the CU 101 of the PU 81, and thus, is capable of executing the determined processing in each of the PUs 81. The program identification information, for example, is a beginning address of the IMEM 83 in which the program (an instruction) is stored, a program number, or the like. In a case where the processing is designated according to the program number, a storage destination of the program having the program number is known.

In addition, the CCU 82 also supplies a synchronization signal that is a standard of a timing when the PU 81 starts the processing, to the PU 81. It is desirable that the synchronization signals supplied from the CCU 82 to each of the PUs 81, are in a relationship of multiplication or division, in order to match a timing when each of the PUs 81 executes the processing.

The IMEM 83 stores a plurality of programs (instructions) to be used in each of the PUs 81. In the example of FIG. 4, five programs of Prg1 to Prg5 are stored.

The CU 101 acquires the designated program from the IMEM 83, on the basis of the program identification information supplied from the CCU 82, supplies the program to all of the PEs 102 in the PU 81, and executes predetermined arithmetic processing in a single instruction stream multiple data stream (SIMD) format.

Specifically, the CU 101 includes an address control unit 111 and an instruction decoder 112. In a case where a beginning address of a program of an execution target is supplied as the program identification information, the address control unit 111 sequentially designates the beginning address of the IMEM 83 on which an instruction is given from the CCU 82, to a final address in which the designated program is stored, and requests an instruction code stored in the designated address. The instruction decoder 112 decodes the instruction codes sequentially supplied from the IMEM 83, and supplies the instruction codes to each of the PEs 102.

The PE 102 sequentially performs the processing (pipeline processing) with respect to the instruction codes to be sequentially supplied from the instruction decoder 112 of the CU 101, and thus, executes one program, that is, the predetermined arithmetic processing with respect to the pixel signal.

The PE 102 includes at least an arithmetic and logic unit (ALU) 121, a flip-flop 122, a data reference unit 123, and a data output unit 124.

The ALU 121 is a processor element performing a logical operation or four arithmetic operations, and performs an arithmetic operation based on the instruction code to be supplied from the instruction decoder 112. The ALU 121, as necessary, is capable of using data temporarily stored in the flip-flop 122, data arithmetically operated in the other PE 102 obtained by the data reference unit 123, data retained in the frame memory 17, and the like.

The flip-flop 122 temporarily stores an arithmetic result of the ALU 121.

The data reference unit 123 suitably refers to (acquires) the data which is necessary for the arithmetic operation of the ALU 121 and is retained in the PEs 102 other than the own PE 102, and supplies the data to the ALU 121. Specifically, the data reference unit 123 is capable of referring to a parameter or the like supplied from the external circuit, in which an arithmetic result of the adjacent PEs 102 or the PEs 102 from which one or more PEs 102 are separated (including the PE 102 of the other PU 81), and the data retained in the frame memory 17 can be acquired through the CCU 82.

The data output unit 124 outputs the arithmetic result of the ALU 121, to the other PE 102, the frame memory 17, the output circuit 22, or the like.

In the PU 81 configured as described above, the CCU 82 is capable of designating a predetermined instruction in the plurality of instructions stored in the IMEM 83, and of allowing each of the PEs 102 to execute the predetermined instruction in the SIMD format. In addition, it is also possible to switch the instruction to be executed in each of the PEs 102, or to sequentially execute the instructions in combination.

However, all of the plurality of PEs 102 in one PU 81 are only capable of performing the same processing. In contrast, each of the plurality of PUs 81 is capable of executing different processings. In other words, a process unit capable of executing different processings (instructions), is the PU 81.

Accordingly, in unit of the PE 102 in the PU 81, the processing is executed in the SIMD format, but in unit of the PU 81, a plurality of arithmetic processings can be executed in a multiple instruction stream multiple data stream (MIMD) format.

The PU 81 includes the CU 101 and the PE 102, as a control sequencer, corresponding to processing region unit of one or more pixels, and thus, is capable of corresponding to a variation in the processing region of the pixel array portion 14, and a variation in processing at each frame rate and a reading timing. In addition, the CCU 82 controlling the PU 81, is provided, and thus, it is possible to change the program or to control an arithmetic order.

<4. Image Signal Processing Execution Example>

Next, a processing execution example of each of the PUs 81 will be described with reference to FIG. 5 to FIG. 7.

Figure 5:
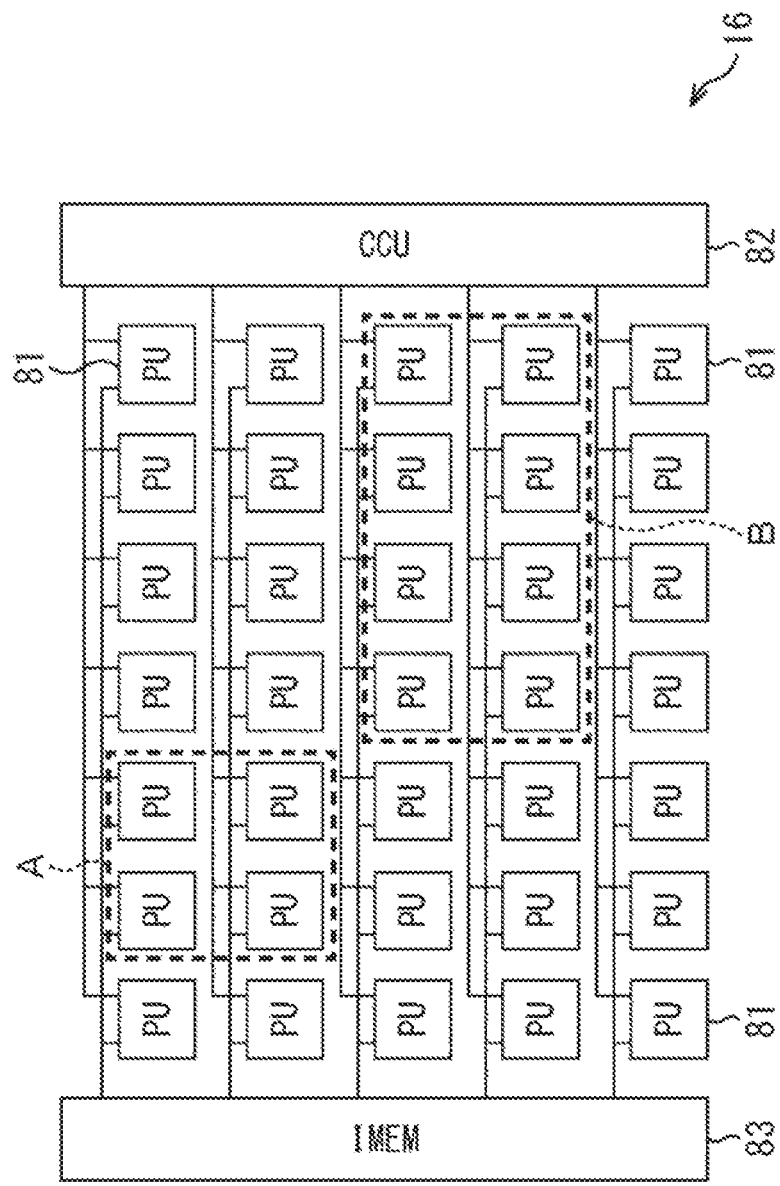
FIG. 5 is a diagram illustrating a processing execution example of each PU.

The image signal processing circuit 16 illustrated in FIG. 5, includes 35 PUs 81 of 5×7, the CCU 82, and the IMEM 83.

As with the example described above, in a case where one PE 102 is allocated to one pixel, and one PU 81 includes 25 PEs 102 of 5×5, the pixel array portion 14 includes 875 (=25×35) pixels of 25 pixels in the vertical direction and 35 pixels in horizontal direction.

Hereinafter, in each of 35 PUs 81 arranged in 5×7, the x-th PU 81 (x>0) from a left end in the horizontal direction (a lateral direction), and the y-th PU 81 (y>0) from an upper end in the vertical direction, represent $PU_{(x, y)}$ 81.

FIG. 5 illustrates an example in which the CCU 82 sets two processing regions of a processing region A including four PUs 81 of a $PU_{(2, 1)}$ 81, a $PU_{(3, 1)}$ 81, a $PU_{(2, 2)}$ 81, and a $PU_{(3, 2)}$ 81, and a processing region B including eight PUs 81 of a $PU_{(4, 3)}$ 81 to a $PU_{(2, 3)}$, and a $PU_{(4, 4)}$ 81 to a $PU_{(7, 4)}$, in each of 35 PUs 81, and executes different processings in the processing regions. For example, filter processing (arithmetic processing using the pixel signal of the adjacent pixels) to be performed with respect to the imaged image is different between the processing region A and the processing region B.

In each of 35 PUs 81, the PUs 81 other than the processing regions A and B are not used, and are in an idle state. All of the PUs 81 can be respectively designated to perform different processings, but the number of programs stored in the IMEM 83 increases, and the number of accesses between each of the PUs 81 and the IMEM 83 also increases, and thus, in general, the number of regions to be allocated or the number of processings is set to approximately several to several tens, with respect to all of the PUs 81.

Figure 6:
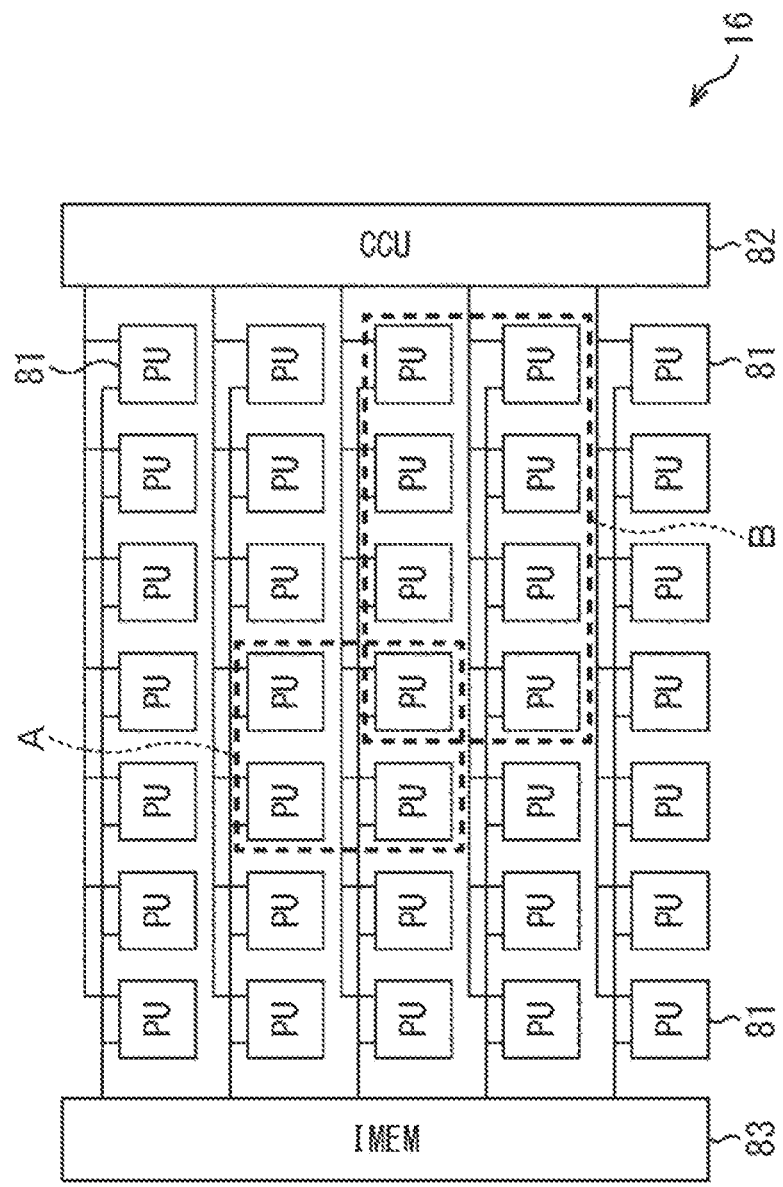
FIG. 6 is a diagram illustrating a processing execution example of each of the PUs.

For example, in a case where the processing region A is moved according to a processing result, as with motion detection processing of a subject in the imaged image, as illustrated in FIG. 6, a part of the processing region A overlaps with a part of the processing region B. In an example of FIG. 6, the processing region A is changed to a processing region including the $PU_{(3, 2)}$ 81, a $PU_{(4, 2)}$ 81, a $PU_{(3, 3)}$ 81, and the $PU_{(4, 3)}$ 81, and the $PU_{(4, 3)}$ 81 belongs to both of the processing region A and the processing region B. In this case, the CCU 82 determines and gives an instruction on which processing of processing as the processing region A and processing as the processing region B is executed with respect to the $PU_{(4, 3)}$ 81.

<Image Signal Processing Flow>

Image signal processing performed by the image signal processing circuit 16 will be described with reference to a flowchart of FIG. 7.

First, in step S1, the CCU 82 determines processing to be executed in each of the PUs 81, on the basis of the processing control signal supplied from the outside through the input circuit 21, and supplies the program identification information corresponding to the determined processing, to the CU 101 of each of the PUs 81.

In step S2, the CU 101 of each of the PUs 81 determines whether or not the program identification information is supplied. In step S2, in a case where it is determined that the program identification information is not supplied, the processing is ended. Therefore, the PU 81 to which the program identification information is not supplied, does not execute any processing.

In step S2, in a case where it is determined that the program identification information is supplied, the processing proceeds to step S3, and the CU 101 determines whether or not it is a timing for starting the processing, on the basis of the synchronization signal supplied from the CCU 82.

In step S3, in a case where it is determined that it is a timing for starting the processing, by waiting until it is determined that it is a timing for starting the processing, the processing proceeds to step S4, and the address control unit 111 of the CU 101 accesses a predetermined address of the IMEM 83 in which a program identified by the program identification information, is stored, and acquires the instruction code.

In step S5, the instruction decoder 112 of the CU 101 decodes the instruction code acquired from the IMEM 83, and supplies the instruction code to each of the PEs 102.

In step S6, each of the PEs 102 in the PU 81, executes the supplied instruction code. That is, each of the PEs 102 executes predetermined arithmetic processing defined by the instruction code.

In step S7, the address control unit 111 of the CU 101 determines whether or not the address accessed in step S4 is the final address in which the designated program is stored.

In step S7, in a case where it is determined that the address accessed in step S4, is not the final address of the designated program, the processing returns to step S4, and the processings from step S4 are repeated. With this arrangement, an instruction code of the next address of the address accessed in step S4 of the previous time, is executed by each of the PEs 102 in the PU 81.

On the other hand, in step S7, in a case where it is determined that the address accessed in step S4, is the final address of the designated program, the processing is ended.

FIG. 8 is a flowchart illustrating the PU 81 of the processing regions A and B, the CCU 82, and each processing of the IMEM 83, in parallel, in a case where two processing regions A and B are set with respect to all of the PUs 81 as illustrated in FIG. 5, and the processing is executed.

In step S21, the program identification information is supplied to each of the PUs 81 of a processing execution target, from the CCU 82. For example, program identification information of identifying Prg1 is supplied to the PU 81 of the processing region A from the CCU 82, and program identification information of identifying Prg2 is supplied to the PU 81 of the processing region B.

Then, in step S22, in a case where the synchronization signal is supplied to each of the PUs 81 from the CCU 82, in step S23, each of the PUs 81 accesses the storage destination of the program (a predetermined address of the IMEM 83) designated by the program identification information, acquires the instruction code, and decodes the instruction code, and then, executes the instruction code. The PU 81 of the processing region A acquires instruction codes in the order from a beginning address Adr1 in which Prg1 is stored, and executes the instruction codes. The PU 81 of the processing region B acquires instruction codes in the order from a beginning address Adr2 in which Prg2 is stored, and executes the instruction codes.

In a case where the program to be executed in the PU 81, is not changed, the processings of steps S22 and S23 are repeated each time when the synchronization signal is supplied.

In a case where the program to be executed in the PU 81, is changed, in step S31, the CCU 82 supplies the program identification information only to the PU 81 to be changed. For example, in a case where the processing to be performed by the PU 81 of the processing region A is changed from Prg1 to Prg3, program identification information of identifying Prg3 is supplied to the PU 81 of the processing region A. Such change processing, for example, is performed by using a vertical blank period.

Then, in step S32, in a case where the synchronization signal is supplied to each of the PUs 81 from the CCU 82, in step S33, the PU 81 of the processing region A acquires instruction codes in the order from a beginning address Adr3 in which Prg3 is stored, and executes the instruction codes. On the other hand, the PU 81 of the processing region B to which new program identification information is not supplied, acquires instruction codes in the order from the beginning address Adr2 in which the Prg2 is stored as described above, and executes the instruction codes.

As described above, the solid-state imaging device 1 includes the image signal processing circuit 16 provided with the PU 81, the CCU 82, and the IMEM 83, and thus, is capable of corresponding to an arbitrary change in imaging processing of the pixel array portion 14. Specifically, the plurality of processing regions are set in the pixel array portion 14, and thus, even in a case where the processing contents (programs) or the frame rates of the processing regions are changed, it is possible to perform the signal processing corresponding to the change. In addition, even in a case where a region size is changed, or the program or the arithmetic order is changed, in a predetermined processing region, while predetermined processing is performed in the other processing region in the pixel array portion 14, it is possible to perform the signal processing corresponding to the change. In addition, the arithmetic processing corresponding to the change in the program or the change in the arithmetic order, can be switched in the vertical blank period, and thus, it is possible to eliminate an invalid frame, and for example, it is possible to change the frame rate without any invalid frame.

<5. Laminated Structure Example of Solid-State Imaging Device>

A solid-state imaging device 1 of FIG. 1 is capable of having a laminated structure in which two or three semiconductor substrates are laminated. In case where the solid-state imaging device 1 has a laminated structure of a plurality of semiconductor substrates, the arrangement of each of the units will be described with reference to FIGS. 9A, 9B, 9C, 10A, 10B, 10C, 11A, 11B, 11C, 12A, 12B, 12C, 13A, 13B, 14A, and 14B.

Furthermore, in FIGS. 9A, 9B, 9C, 10A, 10B, 10C, 11A, 11B, 11C, 12A, 12B, 12C, 13A, 13B, 14A, and 14B, the same reference numerals will be applied to portions in common with those of FIG. 1, FIG. 4, and the like, described above, and the description thereof will be suitably omitted.

FIGS. 9A, 9B, 9C, 10A, 10B, and 10C illustrate an example of a laminated structure in which each circuit of the solid-state imaging device 1 is arranged by being divided into three laminated semiconductor substrates, and the solid-state imaging device 1 does not include the frame memory 17.

On the other hand, FIGS. 11A, 11B, 11C, 12A, 12B, and 12C illustrate an example of a laminated structure in a case where each circuit of the solid-state imaging device 1 is arranged by being divided into three laminated semiconductor substrates, and the solid-state imaging device 1 includes the frame memory 17.

Figure 13A:
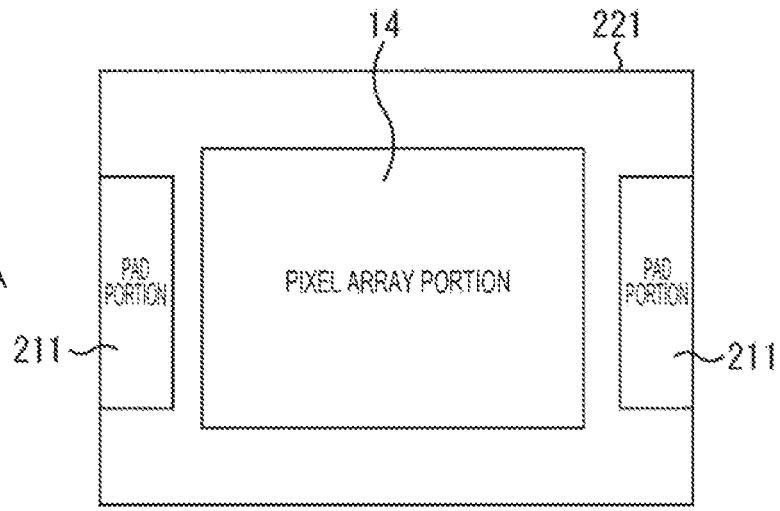
FIGS. 13A and 13B are diagrams illustrating a fifth laminated structure of the solid-state imaging device.
Figure 13B:
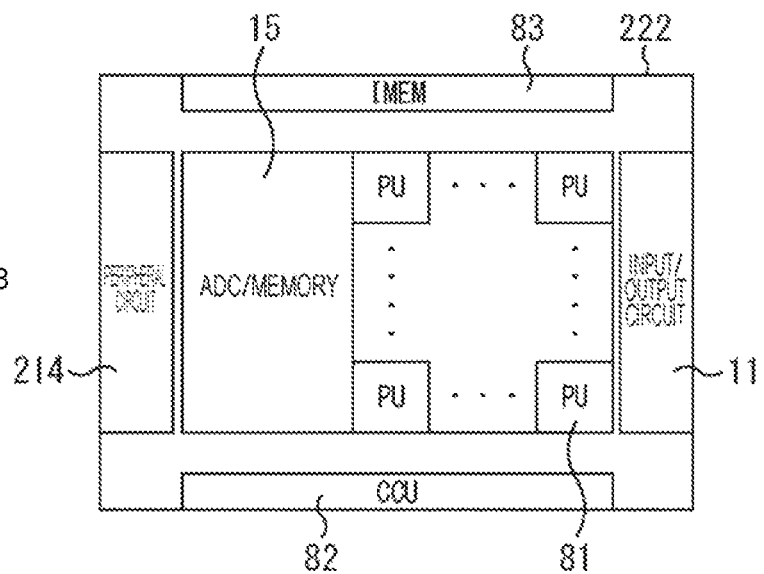
Figure 14A:
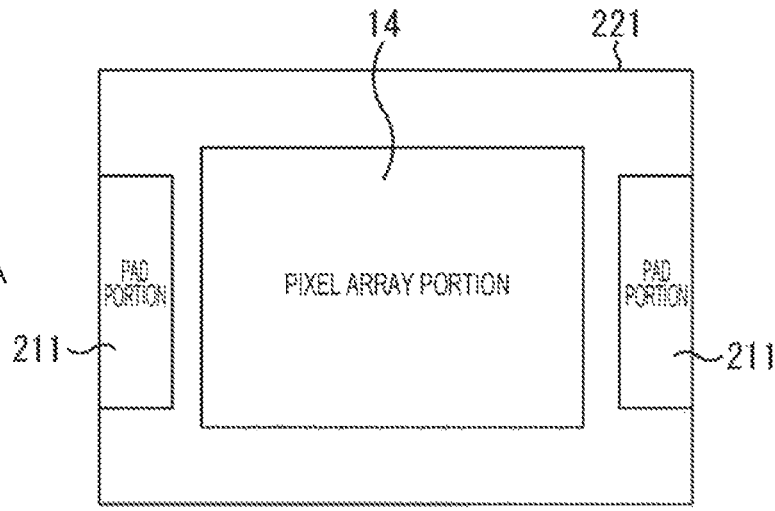
FIGS. 14A and 14B are diagrams illustrating a sixth laminated structure of the solid-state imaging device.
Figure 14B:
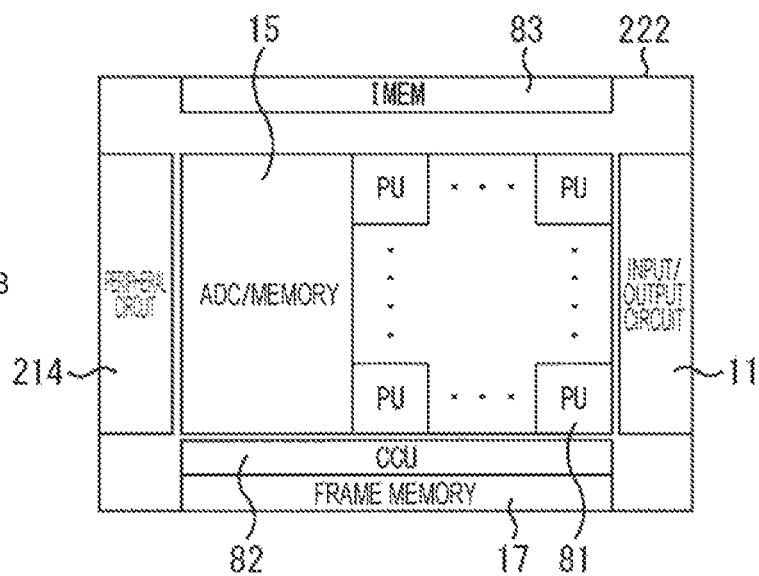

On the other hand, FIGS. 13A, 13B, 14A, and 14B are an example in which each circuit of the solid-state imaging device 1 is arranged by being divided into two laminated semiconductor substrates, and FIGS. 13A and 13B illustrate an example of a laminated structure in a case where the solid-state imaging device 1 does not include the frame memory 17, and FIGS. 14A and 14B illustrate an example of a laminated structure in a case where the solid-state imaging device 1 includes the frame memory 17.

<First Laminated Structure>

Figure 9A:
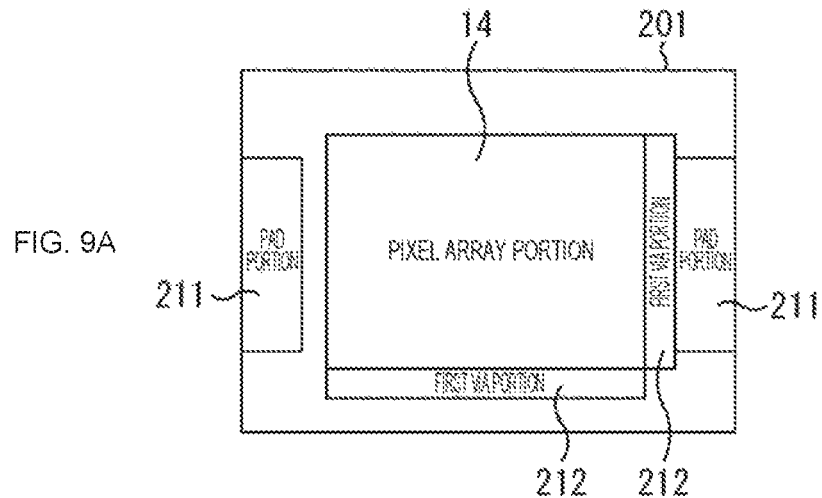
FIGS. 9A, 9B, and 9C are diagrams illustrating a first laminated structure of the solid-state imaging device.
Figure 9B:
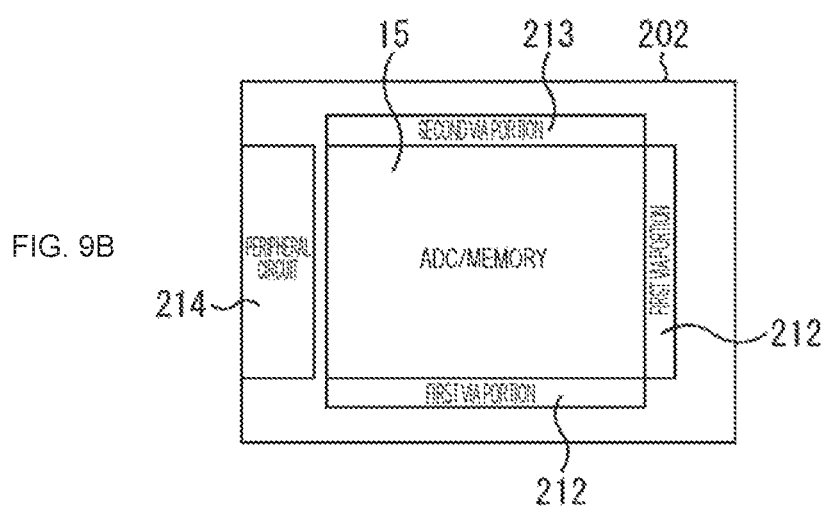
Figure 9C:
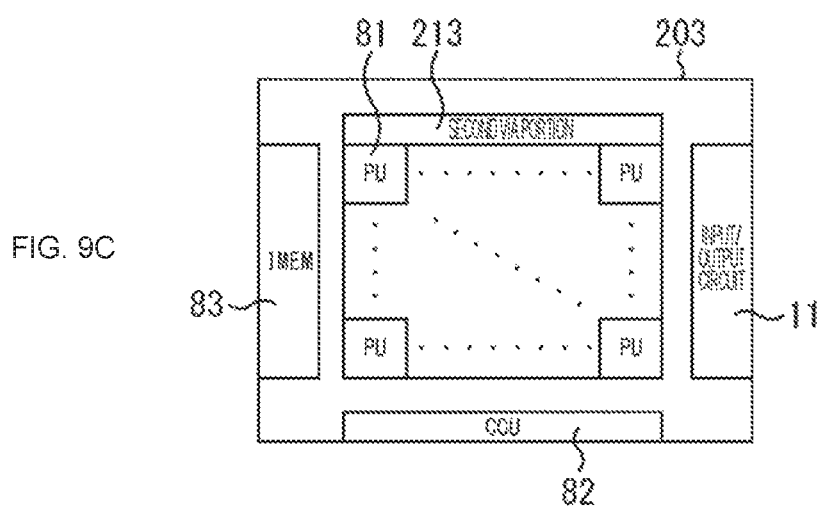

FIGS. 9A, 9B, and 9C illustrate an example where the solid-state imaging device 1 not including the frame memory 17 has a laminated structure of three semiconductor substrates, which is a first laminated structure.

In the first laminated structure, the solid-state imaging device 1 includes a first semiconductor substrate 201 arranged on the uppermost layer, a second semiconductor substrate 202 arranged on the intermediate layer, and a third semiconductor substrate 203 arranged on the lowermost layer, by setting an incident surface side on which light received by each of the pixels 31 of the pixel array portion 14 is incident, as an upper side.

As illustrated in FIG. 9A, the pixel array portion 14 is arranged on the first semiconductor substrate 201 arranged on the uppermost layer. In addition, a PAD portion 211 in which an electrode pad for wire bonding is arranged, is arranged in a neighboring region of at least one side in four sides of the outer circumferential portion of the first semiconductor substrate 201. Further, a first via portion 212 of electrically connecting the first semiconductor substrate 201 and the second semiconductor substrate 202 together, is arranged in a neighboring region of at least one side in four sides on the outside of the pixel array portion 14. In the example of FIG. 9A, in the outer circumferential portion of four sides of the first semiconductor substrate 201, the PAD portion 211 is arranged in the outer circumferential portion of two predetermined facing sides (two sides on the right side and the left side in FIGS. 9A, 9B, and 9C), and the first via portion 212 is arranged on two predetermined sides (two sides on the right side and on the lower side in FIGS. 9A, 9B, and 9C) on the outside of the pixel array portion 14.

As illustrated in FIG. 9B, in the second semiconductor substrate 202 arranged on the intermediate layer, the ADC/memory 15 is arranged in the same region as that of the pixel array portion 14 of the first semiconductor substrate 201, and the first via portion 212 on the second semiconductor substrate 202 side is arranged in the same region as that of the first via portion 212 of the first semiconductor substrate 201.

Further, a second via portion 213 of electrically connecting the second semiconductor substrate 202 and the third semiconductor substrate 203 together, is arranged in a neighboring region of at least one side in four sides on the outside of the ADC/memory 15, and a peripheral circuit 214 is arranged in a neighboring region of at least one side in four sides of the outer circumferential portion of the second semiconductor substrate 202. In the example of FIG. 9B, the second via portion 213 is arranged on one of two predetermined sides (a side on the upper side in FIGS. 9A, 9B, and 9C) on the outside of the ADC/memory 15, on which the first via portion 212 is not arranged, and the peripheral circuit 214 is arranged on a predetermined one side (a side on the left side in FIGS. 9A, 9B, and 9C) of the outer circumferential portion of the second semiconductor substrate 202. The peripheral circuit 214 corresponds to the timing control unit 12, the pixel driving unit 13, and the like.

As illustrated in FIG. 9C, in the third semiconductor substrate 203 arranged on the lowermost layer, the plurality of PUs 81 of the image signal processing circuit 16 are arranged in a two-dimensional array, in the same region as that of the ADC/memory 15 of the second semiconductor substrate 202, and the second via portion 213 on the third semiconductor substrate 203 side is arranged in the same region as that of the second via portion 213 of the second semiconductor substrate 202.

In addition, the input/output circuit 11 is arranged in a neighboring region of at least one side in four sides of the outer circumferential portion of the third semiconductor substrate 203, the IMEM 83 of the image signal processing circuit 16 is arranged in a neighboring region of at least another side, and the CCU 82 of the image signal processing circuit 16 is arranged in a neighboring region of at least still another side. In the example of FIG. 9C, the input/output circuit 11 is arranged on a predetermined one side (a side on the right side in FIGS. 9A, 9B, and 9C) of the outer circumferential portion of the third semiconductor substrate 203, the IMEM 83 is arranged on a predetermined one side (a side on the left side in FIGS. 9A, 9B, and 9C), and the CCU 82 is arranged on a predetermined one side (a side on the lower side in FIGS. 9A, 9B, and 9C).

<Second Laminated Configuration Example>

Figure 10A:
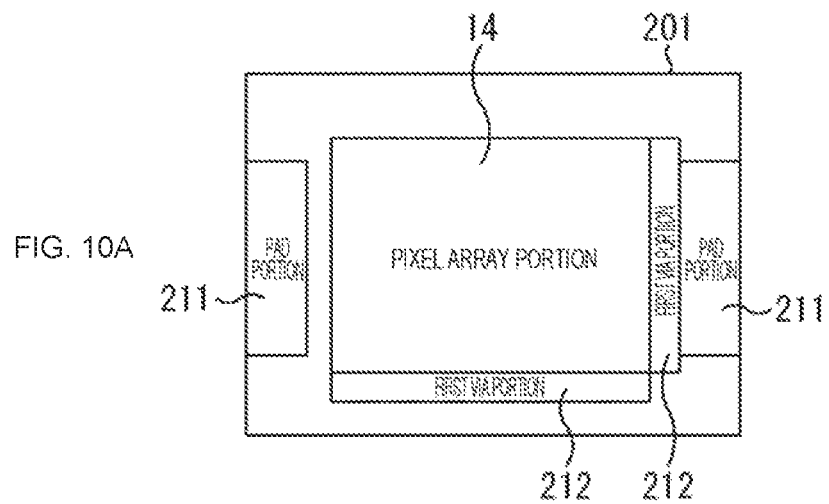
FIGS. 10A, 10B, and 10C are diagrams illustrating a second laminated structure of the solid-state imaging device.
Figure 10B:
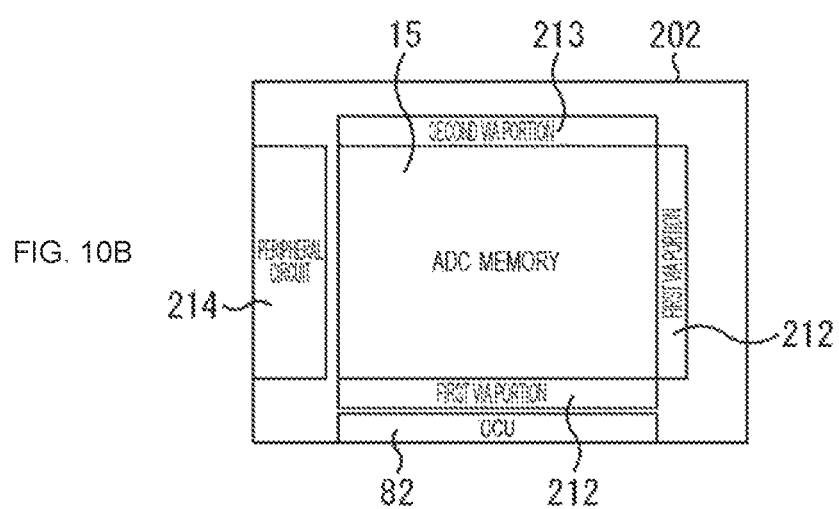
Figure 10C:
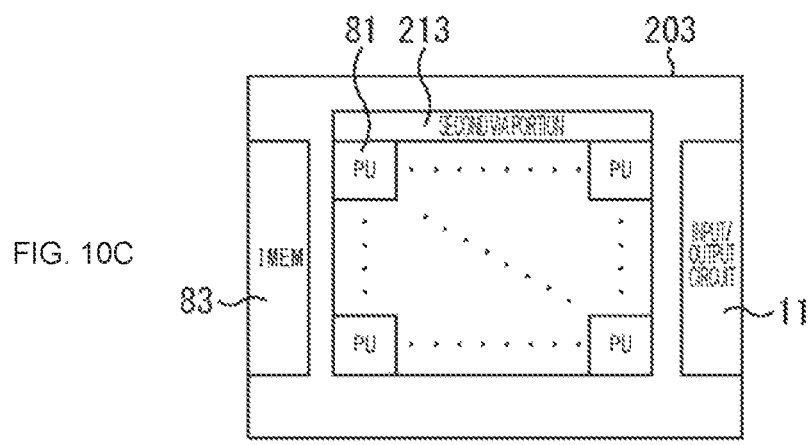

FIGS. 10A, 10B, and 10C illustrate an example in which the solid-state imaging device 1 not including the frame memory 17 has a laminated structure of three semiconductor substrates, which is a second laminated structure.

In FIGS. 10A, 10B, and 10C, the same reference numerals will be applied to portions in common with those of the first laminated structure illustrated in FIGS. 9A 9B, and 9C, and the description thereof will be omitted.

In the second laminated structure of FIGS. 10A, 10B, and 10C, a formation position of the CCU 82 is different from that of the first laminated structure. That is, in the first laminated structure of FIGS. 9A, 9B, and 9C, the CCU 82 is formed on the third semiconductor substrate 203, but in the second laminated structure of FIGS. 10A 10B and 10C, the CCU 82 is formed in a neighboring region of one side (a side on the lower side in FIGS. 10A, 10B, and 10C) on which the peripheral circuit 214 is not formed, in the outer circumferential portion of four sides of the second semiconductor substrate 202. The other circuit arrangements of the second laminated structure, are similar to those of the first laminated structure.

<Third Laminated Configuration Example>

Figure 11A:
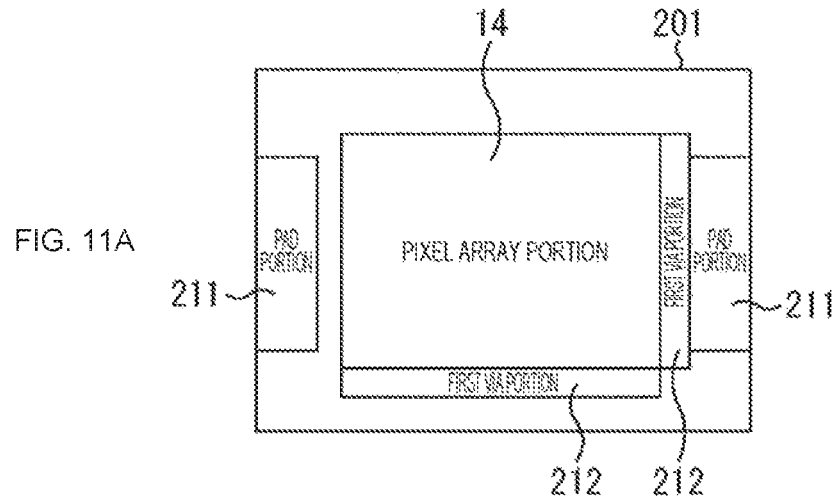
FIGS. 11A, 11B, and 11C are diagrams illustrating a third laminated structure of the solid-state imaging device.
Figure 11B:
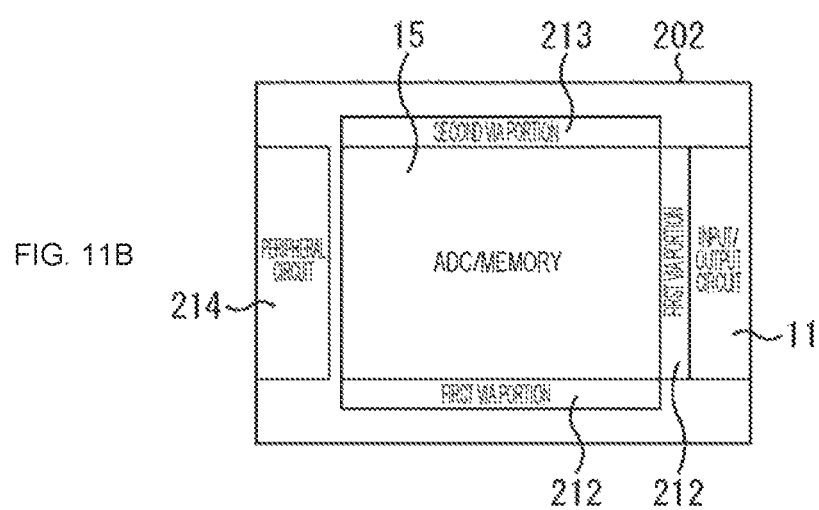
Figure 11C:
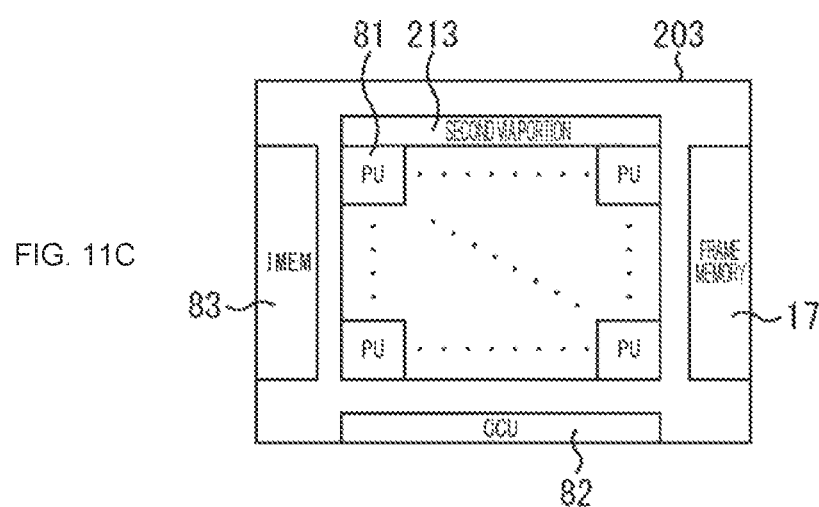

FIGS. 11A, 11B, and 11C illustrate an example in which the solid-state imaging device 1 including the frame memory 17 has a laminated structure of three semiconductor substrates, which is a third laminated structure.

In FIGS. 11A, 11B, and 11C, the same reference numerals will be applied to portions in common with those of the first laminated structure illustrated in FIGS. 9A, 9B, and 9C, and the description thereof will be omitted.

In the third laminated structure of FIGS. 11A, 11B, and 11C, the frame memory 17 is arranged in the position of the input/output circuit 11 of the third semiconductor substrate 203 of the first laminated structure illustrated in FIGS. 9A, 9B, and 9C, and the input/output circuit 11 is arranged on a predetermined one side (a side on the right side in FIGS. 11A, 11B, and 11C) of the outer circumferential portion of the second semiconductor substrate 202. The other circuit arrangements of the third laminated structure, are similar to those of the first laminated structure.

<Fourth Laminated Configuration Example>

Figure 12A:
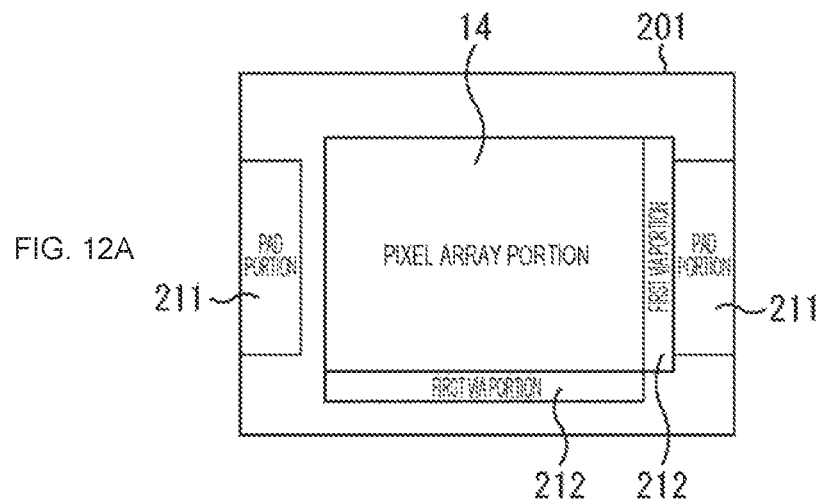
FIGS. 12A, 12B, and 12C are diagrams illustrating a fourth laminated structure of the solid-state imaging device.
Figure 12B:
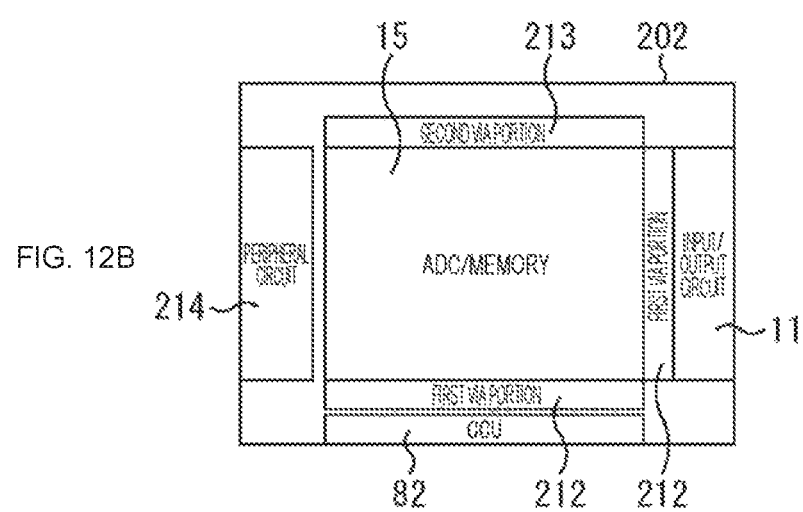
Figure 12C:
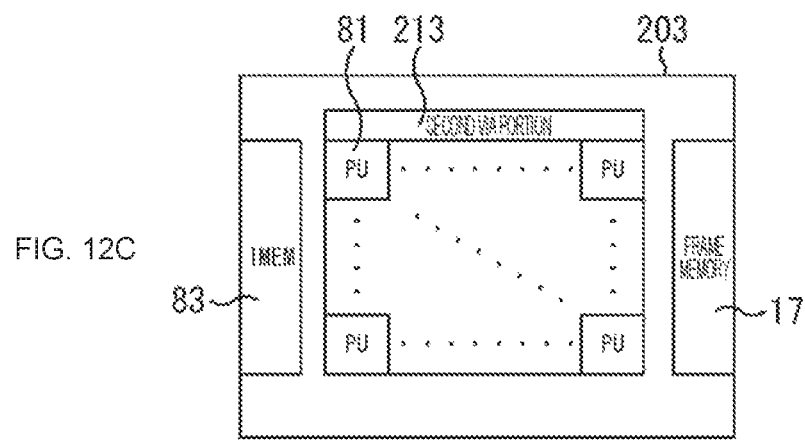

FIGS. 12A, 12B, and 12C illustrate an example in which the solid-state imaging device 1 including the frame memory 17 has a laminated structure of three semiconductor substrates, which is a fourth laminated structure.

In FIGS. 12A, 12B, and 12C, the same reference numerals will be applied to portions in common with those of the third laminated structure illustrated in FIGS. 11A 11B, and 11C, and the description thereof will be omitted.

In the fourth laminated structure of FIGS. 12A, 12B, and 12C, the formation position of the CCU 82 is different from that of the third laminated structure. That is, in the third laminated structure of FIGS. 11A, 11B, and 11C, the CCU 82 is formed on the third semiconductor substrate 203, but in the fourth laminated structure of FIGS. 12A 12B, and 12C, the CCU 82 is formed in a neighboring region of one side (a side on the lower side in FIGS. 12A, 12B, and 12C) on which the peripheral circuit 214 and the input/output circuit 11 are not formed, in the outer circumferential portion of four sides of the second semiconductor substrate 202. The other circuit arrangements of the fourth laminated structure, are similar to those of the third laminated structure.

As described above, in a case of a three-layer laminated structure, the pixel array portion 14 is mainly arranged on the first semiconductor substrate 201, the ADC/memory 15 is mainly arranged on the second semiconductor substrate 202, and the plurality of PUs 81 and the IMEM 83 of the image signal processing circuit 16 are mainly arranged on the third semiconductor substrate 203. The access with respect to the IMEM 83 from each of the PUs 81, is performed in one clock cycle, and thus, it is desirable that the PU 81 and the IMEM 83 are arranged on the same substrate, and may be arranged on different substrates insofar as the access can be performed in one clock cycle. The peripheral circuit 214, the input/output circuit 11, the CCU 82, and the frame memory 17 can be arranged in an arbitrary position of the second semiconductor substrate 202 or the third semiconductor substrate 203.

In the first laminated structure to the fourth laminated structure illustrated in FIGS. 9A, 9B, 9C, 10A, 10B, 10C, 11A, 11B, 11C, 12A, 12B, and 12C, the electrical connection between the first semiconductor substrate 201 and the second semiconductor substrate 202, and the electrical connection between the second semiconductor substrate 202 and the third semiconductor substrate 203, are performed by using via junction.

However, regions between the pixel array portion 14 and the ADC/memory 15, and regions between the ADC/memory 15 and the PU 81 are connected together by using metal bonding such as Cu-Cu instead of the via junction.

<Fifth Laminated Configuration Example>

FIGS. 13A and 13B illustrate an example in which the solid-state imaging device 1 not including the frame memory 17 has a laminated structure of two semiconductor substrates, which is a fifth laminated structure.

In FIGS. 13A and 13B, the same reference numerals will be applied to portions in common with those of the first laminated structure illustrated in FIGS. 9A, 9B, and 9C, and the description thereof will be suitably omitted.

In the fifth laminated structure, the solid-state imaging device 1 includes a first semiconductor substrate 221 arranged on the upper side, and a second semiconductor substrate 221 arranged on the lower side, by setting the incident surface side on which light received by each of the pixels 31 of the pixel array portion 14 is incident, as the upper side.

As illustrated in FIG. 13A, the pixel array portion 14 and the PAD portion 211 are arranged on the first semiconductor substrate 221 arranged on the upper side, as with a case of three-layer structure illustrated in FIGS. 9A, 9B, 9C, 10A, 10B, 10C, 11A, 11B, 11C, 12A, 12B, and 12C.

Then, as illustrated in FIG. 13B, the circuits formed on the second semiconductor substrate 202 and the third semiconductor substrate 203 in the three-layer structure illustrated in FIGS. 9A, 9B, 9C, 10A, 10B, 10C, 11A, 11B, 11C, 12A, 12B, and 12C, that is, the ADC/memory 15, the plurality of PUs 81, the CCU 82, the IMEM 83, the peripheral circuit 214, and the input/output circuit 11 are arranged on the second semiconductor substrate 221 arranged on the lower side.

Furthermore, in the fifth laminated structure of the two-layer structure, the first semiconductor substrate 221 and the second semiconductor substrate 221 are electrically connected to each other by using metal bonding such as Cu-Cu. For this reason, the region of the via portion illustrated in FIG. 9 to FIG. 12 FIGS. 9A, 9B, 9C, 10A, 10B, 10C, 11A, 11B, 11C, 12A, 12B, and 12C, is not provided on the first semiconductor substrate 221 and the second semiconductor substrate 221 of FIGS. 13A and 13B. It is obvious that via junction may be used instead of the metal bonding.

<Sixth Laminated Configuration Example>

FIGS. 14A and 14B illustrate an example in which the solid-state imaging device 1 including the frame memory 17 has a laminated structure of two semiconductor substrates, which is a sixth laminated structure.

In FIGS. 14A and 14B, the same reference numerals will be applied to portions in common with those of the fifth laminated structure illustrated in FIGS. 13A and 13B, and the description thereof will be suitably omitted.

In the sixth laminated structure of FIGS. 14A and 14B, the frame memory 17 is arranged in the position of the CCU 82 of the second semiconductor substrate 221 of the fifth laminated structure illustrated in FIGS. 13A and 13B, and the CCU 82 is arranged to be adjacent to the frame memory 17. The other circuit arrangements of the sixth laminated structure, are similar to those of the fifth laminated structure.

<6. Numbers of PUs and PEs>

Next, the numbers of PUs 81 and PEs 102 of the image signal processing circuit 16 will be described.

In the embodiments described above, an example has been described in which the PU 81 includes the plurality of PEs 102, and the PE 102 is provided in one to one correspondence with respect to the pixel 31.

Figure 15:
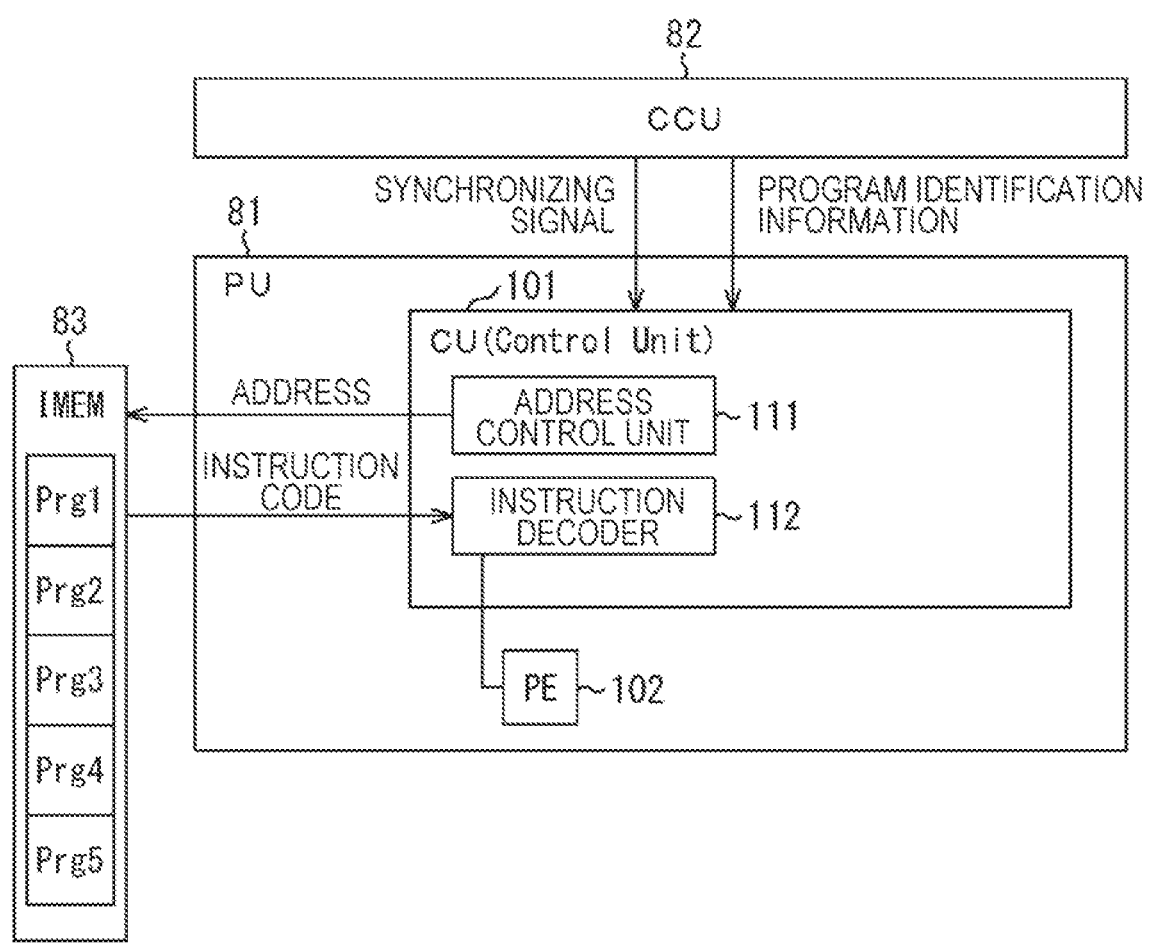
FIG. 15 is a diagram illustrating the detailed configuration of the other PU.

However, the number of PEs 102 included in the PU 81 may be greater than or equal to 1. Therefore, as illustrated in FIG. 15, the minimum configuration of the PU 81 is a configuration in which the PU 81 includes the CU 101 and one PE 102. In the configuration of FIG. 15, in a case where the PE 102 is provided in one to one correspondence with respect to the pixel 31, the numbers of PUs 81 and PEs 102 included in the image signal processing circuit 16, are identical to the number of pixels.

On the other hand, the PE 102 may have a configuration in which one PE 102 is allocated to N×M pixels 31 of N in the row direction and M in the column direction. In this case, the numbers of PUs 81 and PEs 102 included in the image signal processing circuit 16, are less than the number of pixels.

In conclusion, the number of PUs 81 included in the image signal processing circuit 16 may be greater than or equal to 2, and is determined according to the number of PEs 102 included in one PU 81, and the number of pixels to be processed by one PE 102. The number of PEs 102 included in one PU 81 may be greater than or equal to 1.

<7. Application Example with Respect to Electronic Device>

The present technology is not limited to being applied to a solid-state imaging device. That is, the present technology can be applied to a general electronic device using a solid-state imaging device in an image capture unit (the photoelectric conversion unit), such as an imaging device such as a digital still camera or a video camera, a mobile terminal device having an imaging function, and a copier using a solid-state imaging device in an image reading unit. The solid-state imaging device may be formed as one chip, or may be formed as a module having an imaging function, in which an imaging unit and a signal processor or an optical system are collectively packaged.

Figure 16:
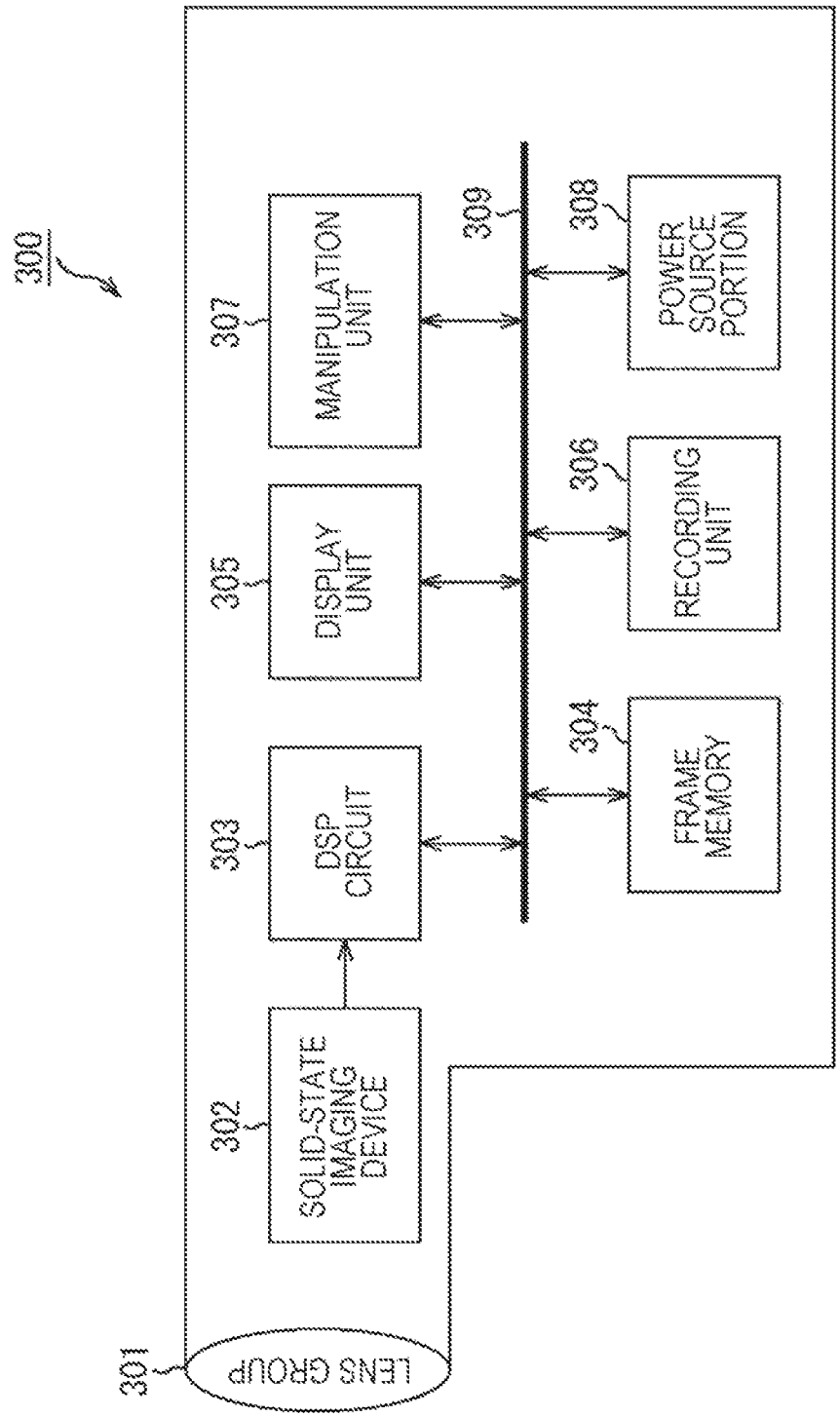
FIG. 16 is a block diagram illustrating a configuration example of an imaging device as an electronic device to which the present technology is applied.

FIG. 16 is a block diagram illustrating a configuration example of an imaging device as an electronic device to which the present technology is applied.

An imaging device 300 of FIG. 16 includes an optical unit 301 including a lens group or the like, a solid-state imaging device (an imaging device) 302 to which the configuration of the solid-state imaging device 1 of FIG. 1 is adopted, and a digital signal processor (DSP) circuit 303 that is a camera signal processing circuit. In addition, the imaging device 300 also includes a frame memory 304, a display unit 305, a recording unit 306, a manipulation unit 307, and a power source portion 308. The DSP circuit 303, the frame memory 304, the display unit 305, the recording unit 306, the manipulation unit 307, and the power source portion 308 are connected to each other through a bus line 309.

The optical unit 301 performs image formation on an imaging surface of the solid-state imaging device 302 by capturing incident light (image light) from a subject. The solid-state imaging device 302 converts a light amount of the incident light subjected to the image formation on the imaging surface by the optical unit 301, into an electrical signal in pixel unit, and outputs the electrical signal as a pixel signal. The solid-state imaging device 1 of FIG. 1, that is, a solid-state imaging device which includes the image signal processing circuit 16 provided with the plurality of PUs 81 including one or more PEs 102, and is capable of performing high-speed arithmetic processing or the like in the plurality of regions in the pixel array portion 14, can be used as the solid-state imaging device 302.

The display unit 305, for example, includes a thin display such as a liquid crystal display (LCD) or an organic electro luminescence (EL) display, and displays a moving image or a still image imaged by the solid-state imaging device 302. The recording unit 306 stores the moving image or the still image imaged by the solid-state imaging device 302, in a recording medium such as a hard disk or a semiconductor memory.

The manipulation unit 307 issues a manipulation instruction with respect to various functions of the imaging device 300, under the manipulation of a user. The power source portion 308 suitably supplies various power sources that are operation power sources of the DSP circuit 303, the frame memory 304, the display unit 305, the recording unit 306, and the manipulation unit 307, to supply targets thereof.

As described above, the solid-state imaging device 1 to which the embodiments described above is applied, is used as the solid-state imaging device 302, and thus, it is possible to correspond to an arbitrary change in the imaging processing. Accordingly, even in a case of the imaging device 300 such as a video camera or a digital still camera, and a camera module for a mobile device such as a mobile phone, it is possible to improve the imaging function and the quality of the imaged image.

<Usage Example of Image Sensor>

Figure 17:
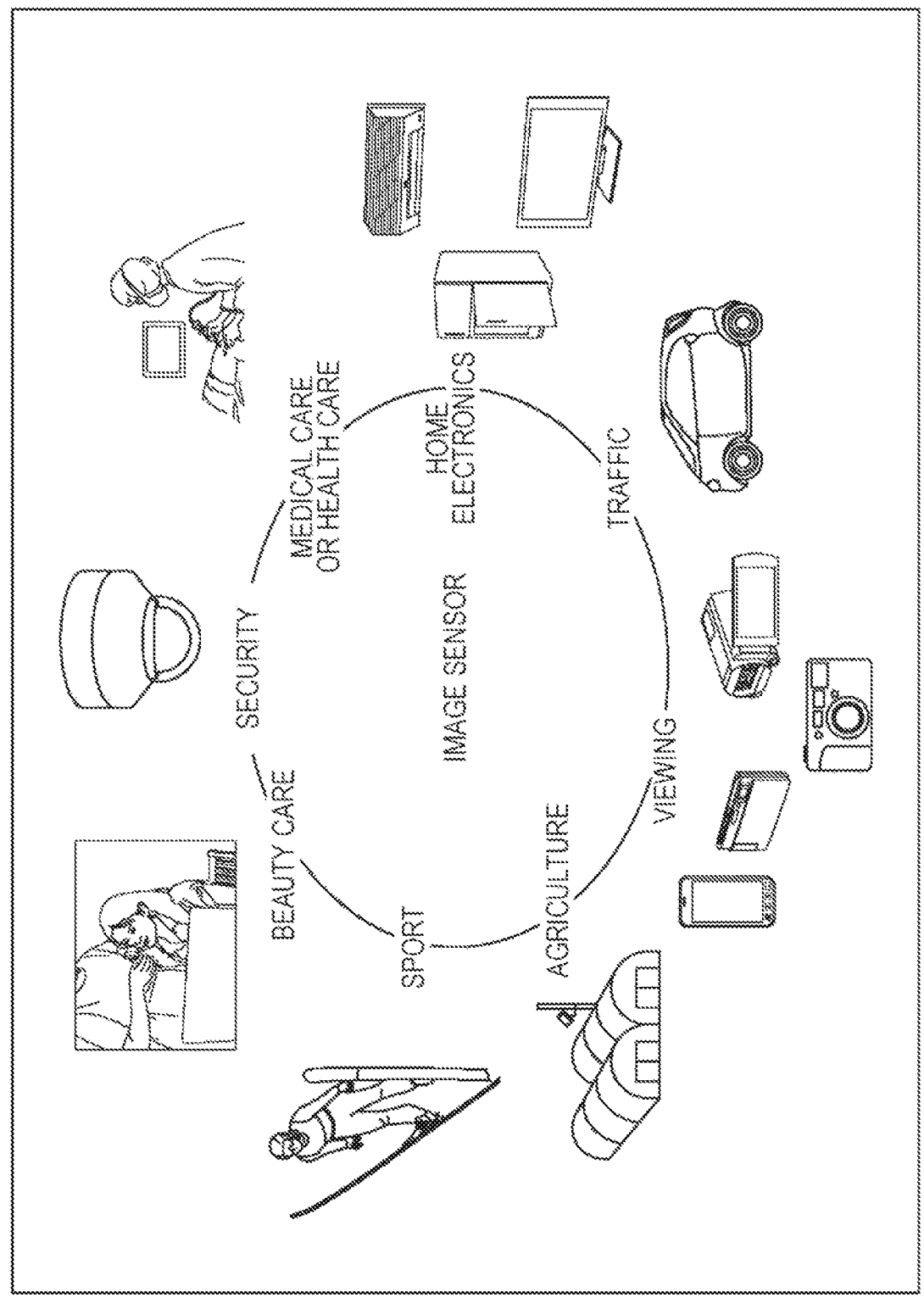
FIG. 17 is a diagram illustrating a usage example of an image sensor.

FIG. 17 is a diagram illustrating a usage example of the image sensor using the solid-state imaging device 1 described above.

The image sensor using the solid-state imaging device 1 described above, for example, can be used in various cases of sensing light such as visible light, infrared light, ultraviolet light, and an X-ray, as follows.

- A device photographing an image to be provided for appreciation, such as a digital camera, or a mobile device having a camera function
- A device to be provided for traffic, such as an in-car sensor photographing the front side or the rear side, the periphery, the inside, or the like of an automobile, a monitoring camera monitoring a running vehicle or a road, and a distance measuring sensor measuring a distance between vehicles or the like, in order for safe driving such as automatic stop, the recognition of the state of a driver, or the like
- A device to be provided for home electronics, such as a TV, a refrigerator, and an air conditioner, in order to photograph the gesture of the user, and to perform a device manipulation according to the gesture
- A device to be provided for medical care or health care, such as an endoscope, and a device photographing a blood vessel by receiving infrared light
- A device to be provided for security, such as a monitoring camera for security use, or a camera for person authentication
- A device to be provided for beauty care, such as a skin measuring instrument photographing the skin, or a microscope photographing the scalp
- A device to be provided for sport, such as an action camera for sport use or the like, or a wearable camera
- A device to be provided for agriculture, such as a camera for monitoring the state of the field or the crops In addition, the present technology is not limited to being applied to a solid-state imaging device in which a distribution of an incident light amount of visible light is sensed, and is imaged as an image, and can be applied to a general solid-state imaging device (a general physical amount distribution sensing device) such as a solid-state imaging device imaging a distribution of an incident amount of an infrared ray or an X-ray, particles, or the like, as an image, or in the broad meaning, a fingerprint detection sensor sensing a distribution of the other physical amount such as a pressure or electrostatic capacitance, as an image.

In addition, the present technology is not limited to being applied to the solid-state imaging device, and can be applied to a general semiconductor device including other semiconductor integrated circuits.

The embodiment of the present technology is not limited to the embodiments described above, and various changes can be made within a range not departing from the gist of the present technology.

For example, a combination of all or a part of a plurality of embodiments described above, can be adopted.

In addition, each of the steps in the flowchart described above, can be executed by one device, or can be executed by being shared in a plurality of devices.

Further, in a case where a plurality of processings are included in one step, the plurality of processings included in the one step, can be executed by one device, or can be executed by being shared in a plurality of devices.

Furthermore, the effects described herein are merely an example, and the effect of the present technology is not limited thereto, and effects other than the effects described herein, may be obtained.

Furthermore, the following configurations can also be adopted in the present technology.

(1)
A solid-state imaging device, including:
a pixel array portion in which a plurality of pixels are arranged in a two-dimensional array;
an AD conversion unit configured to perform AD conversion with respect to a pixel signal output from the pixel of the pixel array portion;
a memory configured to retain a digital pixel signal after the AD conversion; and
an image signal processing circuit configured to perform predetermined signal processing with respect to the digital pixel signal,
in which the image signal processing circuit includes:
two or more process units including one or more processor elements configured to execute predetermined arithmetic processing, and a control unit configured to operate the processor element in an SIMD format;
an instruction memory configured to store one or more arithmetic processing instructions; and
a central control unit configured to control the process unit.

(2)
The solid-state imaging device described in (1), in which the process unit includes a plurality of the processor elements.

(3)
The solid-state imaging device described in (1) or (2), in which the processor element is arranged at a proportion of one to the plurality of pixels.

(4)
The solid-state imaging device described in any one of (1) to (3), in which the processor element is arranged at a proportion of one to one pixel.

(5)
The solid-state imaging device described in any one of (1) to (4), further including
a frame memory,
in which the processor element executes the predetermined arithmetic processing by using data retained in the frame memory.

(6)
The solid-state imaging device described in any one of (1) to (5), in which the solid-state imaging device has a laminated structure of a plurality of semiconductor substrates.

(7)
A signal processing method of a solid-state imaging device including a pixel array portion in which a plurality of pixels are arranged in a two-dimensional array, an AD conversion unit configured to perform AD conversion with respect to a pixel signal output from the pixel of the pixel array portion, a memory configured to retain a digital pixel signal after the AD conversion, and an image signal processing circuit configured to perform predetermined signal processing with respect to the digital pixel signal, the image signal processing circuit including two or more process units including one or more processor elements configured to execute predetermined arithmetic processing, and a control unit configured to operate the processor element in an SIMD format, an instruction memory configured to store one or more arithmetic processing instructions, and a central control unit configured to control the process unit, the method including:
allowing the central control unit to determine processing to be performed by the process unit; and
allowing the control unit to acquire the arithmetic processing instruction from the instruction memory, according to control of the central control unit, and to execute the arithmetic processing in the SIMD format by the processor element.

(8)
An electronic device, including:
a solid-state imaging device including:
a pixel array portion in which a plurality of pixels are arranged in a two-dimensional array;
an AD conversion unit configured to perform AD conversion with respect to a pixel signal output from the pixel of the pixel array portion;
a memory configured to retain a digital pixel signal after the AD conversion; and
an image signal processing circuit configured to perform predetermined signal processing with respect to the digital pixel signal,
in which the image signal processing circuit includes:
two or more process units including one or more processor elements configured to execute predetermined arithmetic processing, and a control unit configured to operate the processor element in an SIMD format;
an instruction memory configured to store one or more arithmetic processing instructions; and
a central control unit configured to control the process unit.

REFERENCE SIGNS LIST

1 Solid-state imaging device
14 Pixel array portion
15 ADC/Memory
16 Image signal processing circuit
17 Frame memory
31 Pixel
41 ADC
42 Memory
81 PU
82 CCU
83 IMEM
101 CU
102 PE
201 First semiconductor substrate
202 Second semiconductor substrate
203 Third semiconductor substrate
300 Imaging device
302 Solid-state imaging device

The invention claimed is:
1. A solid-state imaging device, comprising:
a pixel array portion, wherein the pixel array portion includes a first plurality of pixels in a two-dimensional array;

an AD conversion unit configured to execute an AD conversion operation with respect to a pixel signal output from a pixel of the first plurality of pixels;

a first memory configured to retain a digital pixel signal output from the AD conversion unit after the AD conversion operation with respect to the pixel signal; and an image signal processing circuit including:
- a plurality of process units that includes a first process unit and a second process unit, wherein each process unit of the plurality of process units includes:
  - at least one processor element, and
  - a first control unit configured to operate the at least one processor element in a single instruction stream multiple data stream (SIMD) format;
- a second memory configured to store a first arithmetic processing instruction and a second arithmetic processing instruction; and
- a second control unit configured to:
  - set a plurality of processing regions including a first processing region and a second processing region in the pixel array portion, wherein each processing region of the plurality of processing regions includes at least one process unit of the plurality of process units;
  - determine a first arithmetic processing operation for the first processing region and a second arithmetic processing operation for the second processing region, wherein the first arithmetic processing operation is different from the second arithmetic processing operation;
  - determine a specific portion of the first processing region overlaps the second processing region based on a movement of the first processing region; and
  - output program identification information to the first control unit based on the determination that the specific portion of the first processing region overlaps the second processing region, wherein the first control unit is further configured to:
    - acquire the first arithmetic processing instruction and the second arithmetic processing instruction from the second memory based on the program identification information;
    - control the at least one processor element of the first process unit to execute the first arithmetic processing operation on the digital pixel signal from the specific portion of the first processing region based on the first arithmetic processing instruction; and
    - control the at least one processor element of the second process unit to execute the second arithmetic processing operation on the digital pixel signal from the specific portion based on the second arithmetic processing instruction.

2. The solid-state imaging device according to claim 1, wherein each processor element of the at least one processor element is at a proportion of one to a second plurality of pixels of the first plurality of pixels.

3. The solid-state imaging device according to claim 1, wherein each processor element of the at least one processor element is at a proportion of one to one pixel of the first plurality of pixels.

4. The solid-state imaging device according to claim 1, further comprising
a frame memory, wherein
the processor element is further configured to execute the first arithmetic processing operation and the second arithmetic processing operation based on data in the frame memory, and
the data in the frame memory is associated with the first plurality of pixels.

5. The solid-state imaging device according to claim 1, wherein the solid-state imaging device has a laminated structure of a plurality of semiconductor substrates.

6. The solid-state imaging device according to claim 1, wherein the second control unit is further configured to determine an order of execution of each of the first arithmetic processing operation and the second arithmetic processing operation.

7. A signal processing method, comprising:
in a solid-state imaging device including an image signal processing circuit and a pixel array portion in which a plurality of pixels are in a two-dimensional array, the image signal processing circuit further comprising a plurality of process units and a first control unit, the plurality of process units comprising a first process unit and a second process unit, and each process unit of the plurality of process units includes at least one processor element and a second control unit:
executing, by an AD conversion unit of the solid-state imaging device, an AD conversion operation with respect to a pixel signal output from a pixel of the plurality of pixels;
retaining, by a first memory of the solid-state imaging device, a digital pixel signal output from the AD conversion unit after the AD conversion operation with respect to the pixel signal;
storing, by a second memory, at least a first arithmetic processing instruction and a second arithmetic processing instruction;
setting, by the first control unit, a plurality of processing regions including a first processing region and a second processing region in the pixel array portion, wherein each processing region of the plurality of processing regions includes at least one process unit of the plurality of process units;
determining, by the first control unit, a first arithmetic processing operation for the first processing region and a second arithmetic processing operation for the second processing region, wherein the first arithmetic processing operation is different from the second arithmetic processing operation;
determining, by the first control unit, a specific portion of the first processing region overlaps the second processing region based on a movement of the first processing region;
outputting, by the first control unit, program identification information to the second control unit based on the determination that the specific portion of the first processing region overlaps the second processing region;
acquiring, by the second control unit, the first a specific arithmetic processing instruction and the second arithmetic processing instruction from the second memory based on the program identification information;
controlling, by the second control unit, the at least one processor element of the first process unit to execute the first arithmetic processing operation on the digital pixel signal from the specific portion of the first processing region based on the first arithmetic processing instruction; and
controlling, by the second control unit, the at least one processor element of the second process unit to execute the second arithmetic processing operation on the digital pixel signal from the specific portion based on the second arithmetic processing instruction, wherein the at least one processor element is operated in a single instruction stream multiple data stream (SIMD) format.

8. An electronic device, comprising:
a solid-state imaging device including:
- a pixel array portion, wherein the pixel array portion includes a plurality of pixels in a two-dimensional array;
- an AD conversion unit configured to execute an AD conversion operation with respect to a pixel signal output from a pixel of the plurality of pixels;
- a first memory configured to retain a digital pixel signal output from the AD conversion unit after the AD conversion operation with respect to the pixel signal; and
- an image signal processing circuit including:
  - a plurality of process units including a first process unit and a second process unit, wherein each process unit of the plurality of process units includes
    - at least one processor element, and
    - a first control unit configured to operate the at least one processor element in a single instruction stream multiple data stream (SIMD) format;
  - a second memory configured to store at least a first arithmetic processing instruction and a second arithmetic processing instruction; and
  - a second central control unit configured to:
    set a plurality of processing regions including a first processing region and a second processing region in the pixel array portion, wherein each processing region of the plurality of processing regions includes at least one process unit of the plurality of process units;
    determine a first arithmetic processing operation for the first processing region and a second arithmetic processing operation for the second processing region, wherein the first arithmetic processing operation is different from the second arithmetic processing operation;
    determine a specific portion of the first processing region overlaps the second processing region based on a movement of the first processing region; and
    output program identification information to the first control unit based on the determination that the specific portion of the first processing region overlaps the second processing region, wherein the first control unit is further configured to:
    acquire the first arithmetic processing instruction and the second arithmetic processing instruction from the second memory based on the program identification information;
    control the at least one processor element of the first process unit to execute the first arithmetic processing operation on the digital pixel signal from the specific portion of the first processing region based on the first arithmetic processing instruction; and
    control the at least one processor element of the second process unit to execute the second arithmetic processing operation on the digital pixel signal from the specific portion based on the second arithmetic processing instruction.

* * * * *